US012666776B2

(12) United States Patent
Choi et al.

(10) Patent No.: US 12,666,776 B2
(45) Date of Patent: Jun. 23, 2026

(54) DISPLAY DEVICE

(71) Applicant: Samsung Display Co., LTD., Yongin-si (KR)

(72) Inventors: Kyung Ah Choi, Yongin-si (KR); Jin Woo Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 968 days.

(21) Appl. No.: 17/833,121

(22) Filed: Jun. 6, 2022

(65) Prior Publication Data

US 2023/0114254 A1 Apr. 13, 2023

(30) Foreign Application Priority Data

Oct. 7, 2021 (KR) ......................... 10-2021-0133444

(51) Int. Cl.
| | |
|---|---|
| *H10H 29/14* | (2025.01) |
| *H10H 20/831* | (2025.01) |
| *H10H 20/851* | (2025.01) |
| *H10H 29/37* | (2025.01) |
| *H10H 20/813* | (2025.01) |

(52) U.S. Cl.
CPC ...... H10H 29/142 (2025.01); H10H 20/8312 (2025.01); H10H 20/8514 (2025.01); H10H 29/37 (2025.01); *H10H 20/813* (2025.01)

(58) Field of Classification Search
CPC ............. H10H 29/142; H10H 20/8312; H10H 20/8514; H10H 20/813; H10H 20/8316; H10H 20/851; H10H 20/852; H10H 20/855; H10H 29/37; H10H 29/851; H10H 29/14; H10H 29/30; H10H 29/32; H10H 29/34; H10H 29/345; H10H 29/352; H10H 29/362; H10H 29/39; H10H 29/41; H10H 29/45; H10H 29/49; H10H 29/8517; H10H 29/8552; H10H 29/922; H10H 29/942; H10H 29/962; H10H 29/011; H10H 20/8131; H10H 20/8132; H10H 20/8133; H01L 25/0753
See application file for complete search history.

(56) References Cited

U.S. PATENT DOCUMENTS

| | | | | |
|---|---|---|---|---|
| 9,478,583 | B2 * | 10/2016 | Hu | ......................... H10H 20/84 |
| 10,743,425 | B2 | 8/2020 | Park et al. | |
| 10,763,311 | B2 * | 9/2020 | Kim | ..................... H10K 59/35 |

(Continued)

FOREIGN PATENT DOCUMENTS

| | | |
|---|---|---|
| KR | 10-2019-0033476 | 3/2019 |
| KR | 10-2019-0042168 | 4/2019 |

(Continued)

*Primary Examiner* — Yara B Green
*Assistant Examiner* — Benjamin Michael Kupp
(74) *Attorney, Agent, or Firm* — Womble Bond Dickinson (US) LLP

(57) ABSTRACT

A display device includes pixels including a light emitting area and a non-light emitting area; light emitting elements disposed in the light emitting area; and a bank disposed in the non-light emitting area. The bank includes an opening overlapping the light emitting area in a plan view; a first area spaced apart from the opening; and a second area surrounding the opening and the first area, and a thickness of the second area is greater than a thickness of the first area.

20 Claims, 14 Drawing Sheets

(56)  References Cited

U.S. PATENT DOCUMENTS

| | | | |
|---|---|---|---|
| 11,094,741 B2 | 8/2021 | Kim et al. | |
| 11,227,904 B2 | 1/2022 | Dai | |
| 11,895,893 B2 * | 2/2024 | Sun | H10K 71/00 |
| 2017/0213878 A1 | 7/2017 | Song et al. | |
| 2018/0122874 A1 * | 5/2018 | Kim | H10K 59/879 |
| 2022/0052032 A1 | 2/2022 | Li et al. | |

FOREIGN PATENT DOCUMENTS

| | | |
|---|---|---|
| KR | 10-2020-0070493 | 6/2020 |
| KR | 10-2020-0145900 | 12/2020 |

* cited by examiner

DISPLAY DEVICE

CROSS-REFERENCE TO RELATED APPLICATION(S)

This application claims priority to and the benefit of Korean Patent Application No. 10-2021-0133444 under 35 U.S.C. § 119, filed in the Korean Intellectual Property Office (KIPO) on Oct. 7, 2021, the entire contents of which are incorporated herein by reference.

BACKGROUND

1. Technical Field

The disclosure relates to a display device.

2. Description of the Related Art

As interest in an information display is increasing research and development for display devices are continuously conducted.

SUMMARY

The disclosure has been made in an effort to provide a display device that may prevent a color conversion layer provided in each pixel from overflowing into adjacent pixels and may prevent a stain defect.

The objects of the disclosure are not limited to the object mentioned above, and other technical objects that are not mentioned may be clearly understood to a person of an ordinary skill in the art using the following description.

An embodiment provides a display device including pixels including a light emitting area and a non-light emitting area; light emitting elements disposed in the light emitting area; and a bank disposed in the non-light emitting area, wherein the bank includes an opening overlapping the light emitting area in a plan view; a first area spaced apart from the opening; and a second area surrounding the opening and the first area, and a thickness of the second area is greater than a thickness of the first area.

The display device may further include a first electrode and a second electrode spaced apart from each other. The light emitting elements may be disposed between the first electrode and the second electrode.

The display device may further include a first connection electrode disposed on a first end portion of the light emitting elements; and a second connection electrode disposed on a second end portion of the light emitting elements.

The first area may include a first sub-area spaced apart from the opening in a first direction; and a second sub-area spaced apart from the opening in a second direction intersecting the first direction.

A width in the second direction of the first sub-area may be substantially equal to a width in the second direction of the opening.

A width in the first direction of the second sub-area may be substantially equal to a width in the first direction of the opening.

The first area may include a first sub-area and a second sub-area spaced apart from each other, and the opening, the first sub-area, and the second sub-area may be arranged in the second direction.

A width in the first direction of the first sub-area and/or a width in the first direction of the second sub-area may be substantially equal to a width in the first direction of the opening.

The display device may further include a color conversion layer disposed in the opening.

A thickness of the first area may be about 6 μm or more.

The bank may have an inverted tapered shape.

Another embodiment provides a display device including pixels including a light emitting area and a non-light emitting area; a bank including a first opening overlapping in a plan view the light emitting area and a second opening overlapping the non-light emitting area; a color conversion layer disposed in the first opening; a first optical layer disposed on the color conversion layer; and a second optical layer disposed in the second opening.

A thickness of the bank may be thicker than a thickness of the second optical layer.

A thickness of the second optical layer may be about 6 μm or more.

A refractive index of the first optical layer and/or a refractive index of the second optical layer may be about 1.1 to about 1.3.

The first optical layer and the second optical layer may include a same material.

The display device may further include a capping layer disposed between the color conversion layer and the first optical layer.

The pixels may include a first pixel emitting light of a first color; a second pixel emitting light of a second color; and a third pixel emitting light of a third color.

The color conversion layer may include a first color conversion layer disposed in the first pixel; a second color conversion layer disposed in the second pixel; and a scattering layer disposed in the third pixel.

The display device may further include a first color filter disposed on the first color conversion layer; a second color filter disposed on the second color conversion layer; and a third color filter disposed on the scattering layer.

Particularities of other embodiments are included in the detailed description and drawings.

According to the embodiment of the disclosure, it is possible to provide a space capable of accommodating a color conversion layer overflowing from an opening in a process of supplying a color conversion layer in a light emitting area of each pixel by forming a first area having a thickness thinner than that of a second area of a bank in a non-light emitting area. Accordingly, it is possible to prevent the color conversion layer provided to each pixel from overflowing into adjacent pixels.

In addition, since a first area of a bank partially compensates for a step caused by a second area, it is possible to prevent air bubbles from occurring due to the step even when a photo resist is provided on the bank in a subsequent process. In other words, by minimizing bursting of the photoresist due to the air bubbles, it is possible to improve a stain defect caused by deformation and residual of the photo resist in the subsequent process, and thus, it is possible to improve display quality.

Effects of embodiments of the disclosure are not limited by what is illustrated in the above, and more various effects are included in the specification.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1:
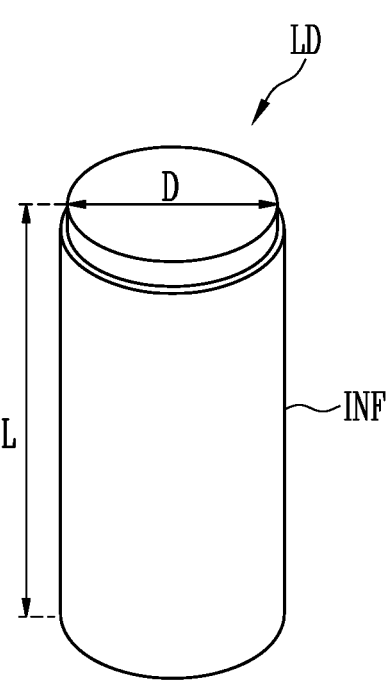
FIG. 1 illustrates a schematic perspective view of a light emitting element according to an embodiment.

Advantages and features of the disclosure and methods of accomplishing the same may be understood more readily by reference to the following detailed description of embodiments and the accompanying drawings. The disclosure may, however, be embodied in different forms and should not be construed as limited to the embodiments set forth herein. The embodiments are provided so that this disclosure will be thorough and complete, and will convey the scope of the disclosure to those skilled in the art.

The terms used herein are for the purpose of describing particular embodiments only and is not intended to be limiting. As used herein, the singular forms "a", "an" and "the" are intended to include the plural forms as well, unless the context clearly indicates otherwise. It will be further understood that the terms "comprise" and/or "comprising", "include" or "including", and "have" or "having", when used in the disclosure, specify the presence of stated elements, steps, operations, and/or devices, but do not preclude the presence or addition of one or more other elements, steps, operations, and/or devices.

In addition, the term "connection" or "coupling" may comprehensively mean a physical and/or electrical connection or coupling. Further, this may comprehensively mean a direct or indirect connection or coupling, and an integrated or non-integrated connection or coupling.

It will be understood that when an element or a layer is referred to as being "on" another element or layer, it can be directly on another element or layer, or intervening element or layer may also be present. Throughout the specification, the same reference numerals denote the same constituent elements.

Although the terms "first", "second", and the like are used to describe various constituent elements, these constituent elements are not limited by these terms. These terms are used only to distinguish one constituent element from another constituent element. Therefore, the first constituent elements described below may be the second constituent elements within the technical spirit of the present disclosure.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

It will be understood that the terms "contact," "connected to," and "coupled to" may include a physical and/or electrical contact, connection, or coupling.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments of the disclosure will be described in detail with reference to the accompanying drawings.

Figure 2:
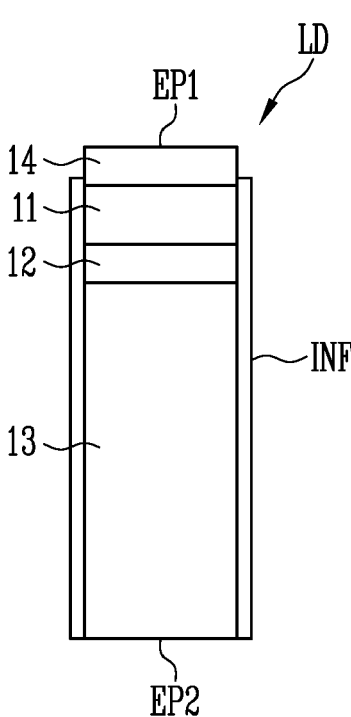
FIG. 2 illustrates a schematic cross-sectional view of a light emitting element according to an embodiment.

FIG. 1 illustrates a schematic perspective view of a light emitting element according to an embodiment. FIG. 2 illustrates a schematic cross-sectional view of a light emitting element according to an embodiment. FIGS. 1 and 2 illustrate a cylindrical shape light emitting element LD, but a type and/or shape of the light emitting element LD is not limited thereto.

Referring to FIGS. 1 and 2, the light emitting element LD may include a first semiconductor layer 11, an active layer 12, a second semiconductor layer 13, and/or an electrode layer 14.

The light emitting element LD may be formed to have a cylindrical shape extending in a direction. The light emitting element LD may have a first end portion EP1 and a second end portion EP2. One of the first and second semiconductor layers 11 and 13 may be disposed on the first end portion EP1 of the light emitting element LD. The remaining one of the first and second semiconductor layers 11 and 13 may be disposed on the second end portion EP2 of the light emitting element LD. For example, the first semiconductor layer 11 may be disposed on the first end portion EP1 of the light emitting element LD, and the second semiconductor layer 13 may be disposed on the second end EP2 of the light emitting element LD.

In some embodiments, the light emitting element LD may be a light emitting element manufactured in a cylindrical shape by an etching method or the like. In the specification, the "cylindrical shape" includes a rod-like shape or bar-like shape with an aspect ratio greater than 1, such as a circular cylinder, a polygonal cylinder, or polyprism, but a shape of a cross-section thereof is not limited.

The light emitting element LD may have a size to a degree of the nanometer scale to the micrometer scale. For example, the light emitting element LD may each have a diameter D (or width) and/or a length L ranging from a nanometer scale to a micrometer scale. However, the size of the light emitting element LD is not limited thereto, and the size of the light emitting element LD may be variously changed according to design conditions of various devices using a light emitting device using the light emitting element LD as a light source, for example, a display device.

The first semiconductor layer 11 may be a first conductive semiconductor layer. For example, the first semiconductor layer 11 may include a p-type semiconductor layer. For example, the first semiconductor layer 11 may include at least one semiconductor material of InAlGaN, GaN, AlGaN, InGaN, and AlN and may include a p-type semiconductor layer doped with a first conductive dopant such as Mg. However, the material included in the first semiconductor layer 11 is not limited thereto, and the first semiconductor layer 11 may be made of various materials.

The active layer 12 may be disposed between the first semiconductor layer 11 and the second semiconductor layer 13. The active layer 12 may include one of a single well structure, a multi-well structure, a single quantum well structure, a multi-quantum well (MQW) structure, a quantum dot structure, and a quantum line structure, but the disclosure is not limited thereto. The active layer 12 may include GaN, InGaN, InAlGaN, AlGaN, or AlN, and in addition, it may include various other materials.

In case that a voltage of a threshold voltage or more is applied to ends of the light emitting element LD, the light emitting device LD emits light while electron-hole pairs are combined in the active layer 12. By controlling the light emission of the light emitting element LD by using this principle, the light emitting element LD may be used as a light source for various light emitting devices, including pixels of a display device.

The second semiconductor layer 13 is disposed on the active layer 12, and may include a semiconductor layer of a type different from that of the first semiconductor layer 11. The second semiconductor layer 13 may include an n-type semiconductor layer. For example, the second semiconductor layer 13 may include a semiconductor material of at least one of InAlGaN, GaN, AlGaN, InGaN, and AlN, and may include an n-type semiconductor layer doped with a second conductive dopant such as Si, Ge, Sn, or the like. However, the material included in the second semiconductor layer 13 is not limited thereto, and the second semiconductor layer 13 may be made of various materials.

The electrode layer 14 may be disposed on the first end portion EP1 and/or the second end portion EP2 of the light emitting element LD. FIG. 2 illustrates the case in which the electrode layer 14 is formed on the first semiconductor layer 11, but the disclosure is not limited thereto. For example, a separate electrode layer may be further disposed on the second semiconductor layer 13.

The electrode layer 14 may include a transparent metal or a transparent metal oxide. As an example, the electrode layer 14 may include at least one of an indium tin oxide (ITO), an indium zinc oxide (IZO), and a zinc tin oxide (ZTO), but the disclosure is not limited thereto. Therefore, in case that the electrode layer 14 is made of the transparent metal or transparent metal oxide, light generated in the active layer 12 of the light emitting element LD may transmit through the electrode layer 14 to be emitted to the outside of the light emitting element LD.

An insulation film INF may be provided on a surface of the light emitting element LD. The insulation film INF may be directly disposed on surfaces of the first semiconductor layer 11, the active layer 12, the second semiconductor layer 13, and/or the electrode layer 14. The insulation film INF may expose the first and second end portions EP1 and EP2 of the light emitting element LD having different polarities. In some embodiments, the insulation film INF may expose side portions of the electrode layer 14 and/or the second semiconductor layer 13 that are adjacent to the first and second end portions EP1 and EP2 of the light emitting element LD.

The insulation film INF may prevent an electrical short circuit that may occur in case that the active layer 12 contacts conductive materials other than the first and second semiconductor layers 11 and 13. In addition, the insulation film INF may minimize surface defects of the light emitting elements LD to improve lifespan and luminous efficiency of the light emitting elements LD.

The insulation film INF may include at least one of a silicon oxide ($SiO_x$), a silicon nitride ($SiN_x$), a silicon oxynitride ($SiO_xN_y$), an aluminum nitride ($AlN_x$), an aluminum oxide ($AlO_x$), a zirconium oxide ($ZrO_x$), a hafnium oxide ($HfO_x$), and a titanium oxide ($TiO_x$). For example, the insulation film INF may be configured as a double layer, and respective layers configuring the double layer may include different materials. For example, the insulation film INF may be formed as a double layer made of an aluminum oxide ($AlO_x$) and a silicon oxide ($SiO_x$), but the disclosure is not limited thereto. In some embodiments, the insulation film INF may be omitted.

A light emitting device including the light emitting element LD described above may be used in various types of devices that require a light source in addition to a display device. For example, the light emitting elements LD may be disposed in each pixel of a display panel, and the light emitting elements LD may be used as a light source of each pixel. However, an application field of the light emitting element LD is not limited to the above-described example. For example, the light emitting element LD may be used in other types of devices that require a light source, such as a lighting device.

Figure 3:
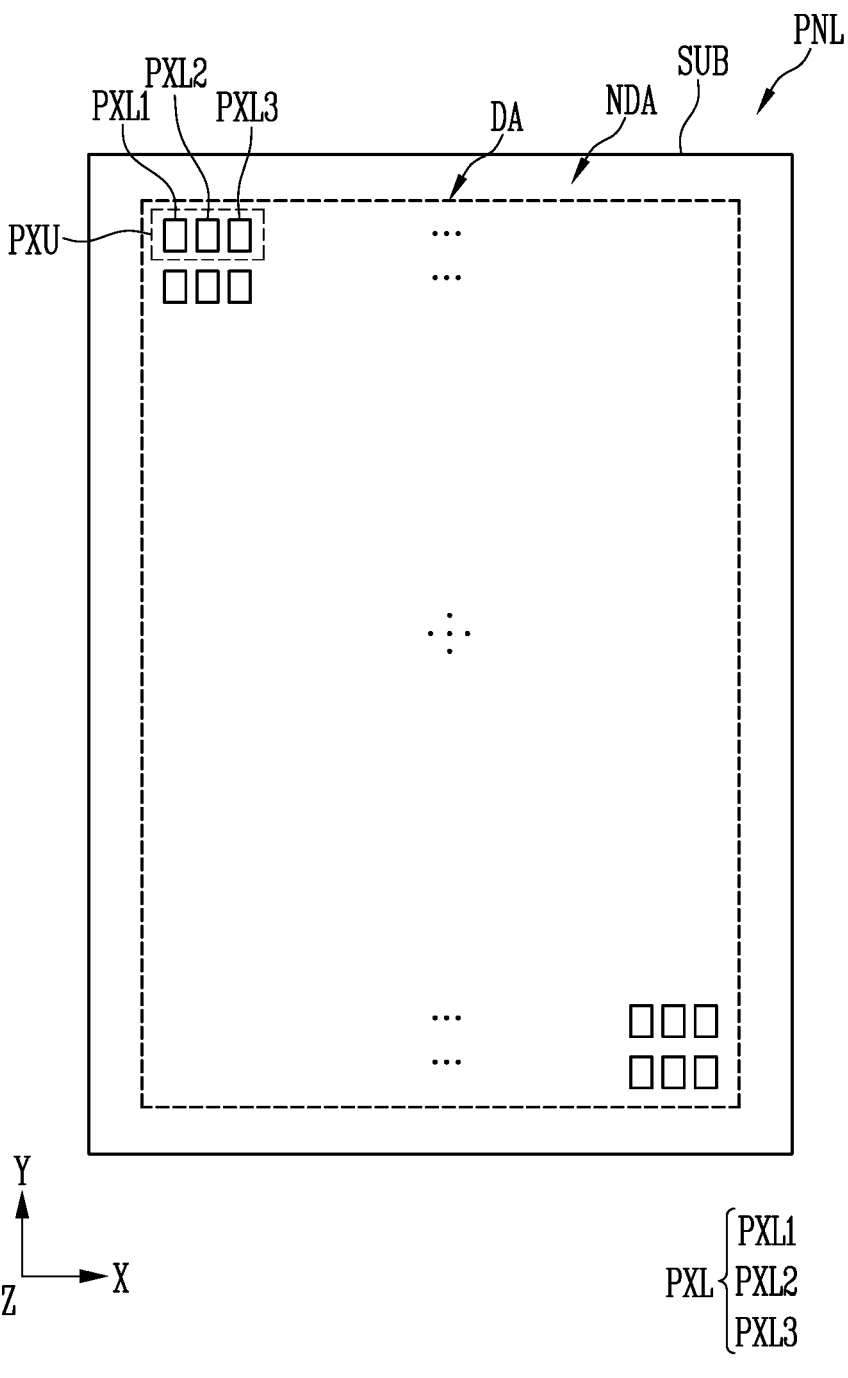
FIG. 3 illustrates a schematic plan view of a display device according to an embodiment.

FIG. 3 illustrates a schematic plan view of a display device according to an embodiment.

FIG. 3 illustrates a display device, in particular, a display panel PNL provided in the display device as an example of an electronic device that may use the light emitting element LD described in the embodiments of FIGS. 1 and 2 as a light source.

For better understanding and ease of description, FIG. 3 briefly illustrates a structure of the display panel PNL based on a display area DA. However, in some embodiments, at least one driving circuit portion (for example, at least one of a scan driver and a data driver), wires, and/or pads, which are not shown, may be further disposed in the display panel PNL.

Referring to FIG. 3, the display panel PNL and a light emitting substrate SUB for forming the display panel PNL include a display area DA for displaying an image and a non-display area NDA other than the display area DA. The display area DA may form a screen on which an image is displayed, and the non-display area NDA may be the remaining area other than the display area DA.

A pixel part PXU may be disposed in the display area DA. The pixel part PXU may include a first pixel PXL1, a second pixel PXL2, and/or a third pixel PXL3. Hereinafter, in case that at least one of the first pixel PXL1, the second pixel PXL2, and the third pixel PXL3 is arbitrarily referred to, or in case that two or more types of pixels thereof are comprehensively referred to, they will be referred to as a "pixel PXL" or "pixels PXL".

The pixels PXL may be regularly arranged according to a stripe or PENTILE™ arrangement structure. However, the arrangement structure of the pixels PXL is not limited thereto, and the pixels PXL may be arranged in the display area DA in various structures and/or methods.

In some embodiments, two or more types of pixels PXL emitting light of different colors may be disposed in the display area DA. For example, in the display area DA, the first pixels PXL1 emitting light of the first color, the second pixels PXL2 emitting light of the second color, and the third pixels PXL3 emitting light of the third color may be arranged. At least one first to third pixels PXL1, PXL2, and PXL3 disposed to be adjacent to each other may form a pixel part PXU that may emit light of various colors. For example, each of the first to third pixels PXL1, PXL2, and PXL3 may be a pixel that emits light of a color (e.g., a predetermined or selected color). In some embodiments, the first pixel PXL1 may be a red pixel that emits red light, the second pixel PXL2 may be a green pixel that emits green light, and the third pixel PXL3 may be a blue pixel that emits blue light, but the disclosure is not limited thereto.

In the embodiment, the first pixel PXL1, the second pixel PXL2, and the third pixel PXL3 are provided with light emitting elements emitting light of a same color, and include color conversion layers and/or color filter layers of different colors disposed on respective light emitting elements, so that they may emit light of the first color, the second color, and the third color, respectively. In an embodiment, the first pixel PXL1, the second pixel PXL2, and the third pixel PXL3 are each provided with a first color light emitting element, a second color light emitting element, and a third color light emitting element as a light source, respectively, so that they respectively emit light of the first color, light of the second color, and light of the third color. However, the color, type, and/or number of pixels PXL configuring each pixel part PXU are not particularly limited. For example, the color of light emitted by each pixel PXL may be variously changed.

The pixel PXL may include at least one light source driven by a control signal (e.g., a predetermined or selected control signal) (for example, a scan signal and a data signal) and/or a power source (e.g., a predetermined or selected power source) (for example, a first power source and a second power source). In the embodiment, the light source may include at least one light emitting device LD according to one of the embodiments of FIGS. 1 and 2, for example, ultra-small cylindrical shape light emitting elements LD having a size to a degree of the nanometer scale to the micrometer scale. However, the disclosure is not limited thereto, and various types of light emitting elements LD may be used as a light source of the pixel PXL.

In the embodiment, each pixel PXL may be configured as an active pixel. However, the type, structure, and/or driving method of pixels PXL that may be applied to the display device are not particularly limited. For example, each pixel PXL may be configured as a pixel of a passive or active light emitting display device of various structures and/or driving methods.

Figure 4:
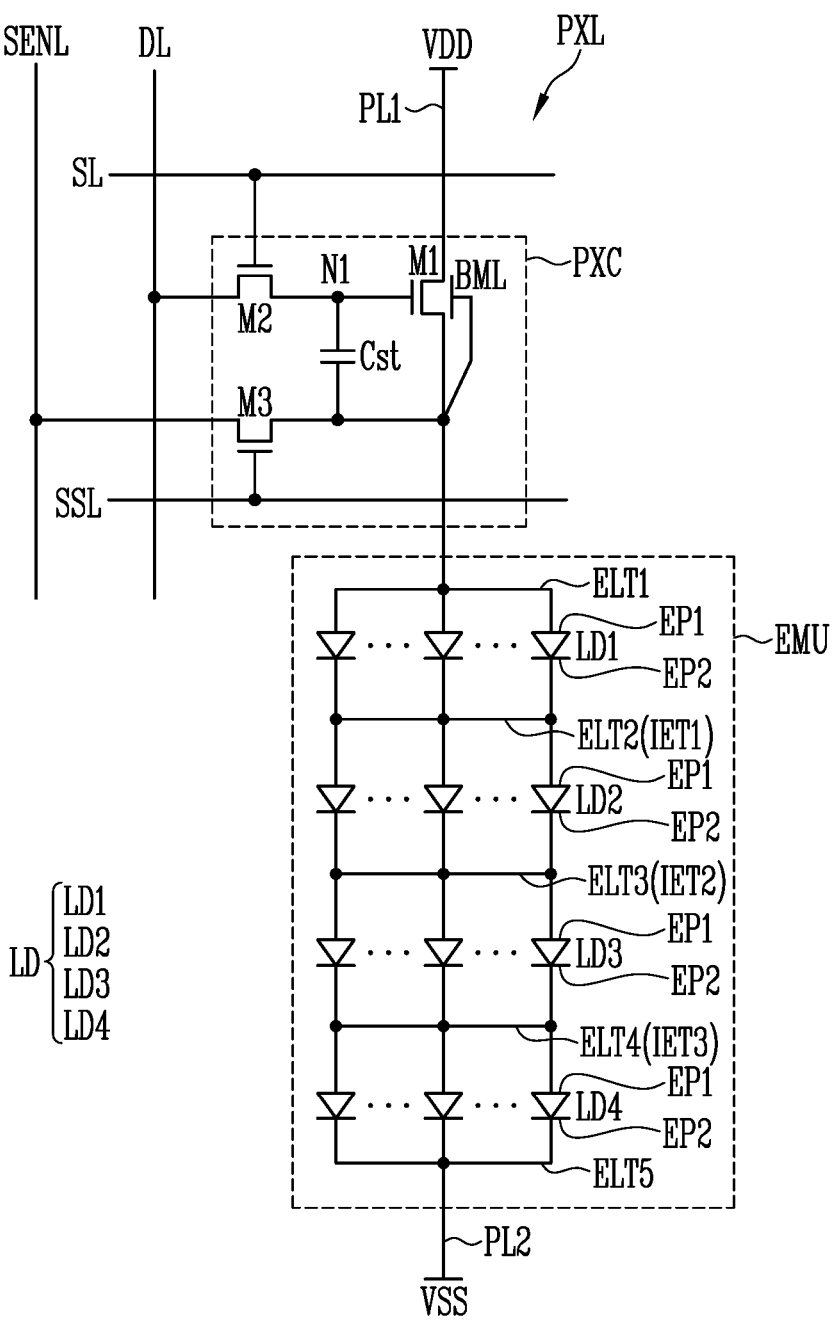
FIG. 4 illustrates a schematic diagram of equivalent circuit of a pixel according to an embodiment.

FIG. 4 illustrates a schematic diagram of an equivalent circuit of a pixel according to an embodiment.

The pixel PXL shown in FIG. 4 may be one of the first pixel PXL1, the second pixel PXL2, and the third pixel PXL3 provided in the display panel PNL of FIG. 3. The first pixel PXL1, the second pixel PXL2, and the third pixel PXL3 may have substantially a same or similar structure.

Referring to FIG. 4, the pixel PXL may further include a light emitting part EMU for generating light at luminance corresponding to a data signal, and a pixel circuit PXC for driving the light emitting part EMU.

The pixel circuit PXC may be electrically connected between a first power source VDD and the light emitting part EMU. In addition, the pixel circuit PXC may be electrically connected to a scan line SL and a data line DL of the pixel PXL to control an operation of the light emitting part EMU in response to a scan signal and a data signal supplied from the scan line SL and the data line DL. In addition, the pixel circuit PXC may be further selectively electrically connected to a sensing signal line SSL and a sensing line SENL.

The pixel circuit PXC may include at least one transistor and a capacitor. For example, the pixel circuit PXC may include a first transistor M1, a second transistor M2, a third transistor M3, and a storage capacitor Cst.

The first transistor M1 may be electrically connected between the first power source VDD and a first connection electrode ELT1. A gate electrode of the first transistor M1 may be electrically connected to a first node N1. The first transistor M1 may control a driving current supplied to the light emitting part EMU in response to a voltage of the first node N1. For example, the first transistor M1 may be a driving transistor that controls a driving current of the pixel PXL.

In the embodiment, the first transistor M1 may optionally include a lower conductive layer BML (also referred to as a "lower electrode", "back gate electrode", or "lower light blocking layer"). The gate electrode of the first transistor M1 and the lower conductive layer BML may overlap (e.g., in a plan view) each other with an insulation layer disposed (or interposed) therebetween. In the embodiment, the lower conductive layer BML may be electrically connected to a first electrode of the first transistor M1, for example a source or drain electrode thereof.

In case that the first transistor M1 includes the lower conductive layer BML, by applying a back-biasing voltage to the lower conductive layer BML of the first transistor M1 when the pixel PXL is driven, a back-biasing technique (or a sync technique) of moving a threshold voltage of the first transistor M1 in a negative or positive direction may be applied. For example, by electrically connecting the lower conductive layer BML to the source electrode of the first transistor M1 to apply a source-sync technique, the threshold voltage of the first transistor M1 may be moved in the negative or positive direction. In addition, in case that the lower conductive layer BML is disposed under a semiconductor pattern forming a channel of the first transistor M1, the lower conductive layer BML may serve as a light blocking pattern to stabilize an operating characteristic of the first transistor M1. However, the function and/or utilization method of the lower conductive layer BML is not limited thereto.

The second transistor M2 may be electrically connected between the data line DL and the first node N1. A gate electrode of the second transistor M2 may be electrically connected to the scan line SL. In case that a scan signal having a gate-on voltage (for example, a high-level voltage) is supplied from the scan line SL, the second transistor M2 may be turned on to electrically connect the data line DL to the first node N1.

For each frame period, a data signal of the corresponding frame is supplied to the data line DL, and the data signal may be transmitted to the first node N1 by the second transistor M2 turned on during a period in which the scan signal of the gate-on voltage is supplied. For example, the second transistor M2 may be a switching transistor for transmitting each data signal to the inside of the pixel PXL.

One electrode (or first electrode) of the storage capacitor Cst may be electrically connected to the first node N1, and the other electrode (or second electrode) thereof may be electrically connected to a second electrode of the first transistor M1. The storage capacitor Cst may be charged with a voltage corresponding to the data signal supplied to the first node N1 during each frame period.

The third transistor M3 may be electrically connected between the first connection electrode ELT1 (or the second electrode of the first transistor M1) and the sensing line SENL. A gate electrode of the third transistor M3 may be electrically connected to the sensing signal line SSL. The third transistor M3 may transmit a voltage applied to the first connection electrode ELT1 to the sensing line SENL according to a sensing signal supplied to the sensing signal line SSL. The voltage transmitted through the sensing line SENL may be provided to an external circuit (for example, a timing controller), and the external circuit may detect characteristic information (for example, a threshold voltage of the first transistor M1) of each pixel PXL based on the supplied voltage. The detected characteristic information may be used to convert image data so that a characteristic deviation between the pixels PXL is compensated.

FIG. 4 illustrates that all the transistors included in the pixel circuit PXC are N-type transistors, but the disclosure is not limited thereto. For example, at least one of the first, second, and third transistors M1, M2, and M3 may be changed to a P-type transistor.

In addition, the structure and driving method of the pixel PXL may be variously changed. For example, the pixel circuit PXC may be configured as a pixel circuit having various structures and/or using driving methods in addition to that of the embodiment shown in FIG. 4.

For example, the pixel circuit PXC may not include the third transistor M3. In addition, the pixel circuit PXC may further include other circuit elements such as a compensation transistor for compensating for a threshold voltage of the first transistor M1, an initialization transistor for initializing the voltage of the first node N1 and/or of the first connection electrode ELT1, a light emission control transistor for controlling a period in which a driving current is supplied to the light emitting part EMU, and/or a boosting capacitor for boosting the voltage of the first node N1.

The light emitting part EMU may include at least one light emitting element LD electrically connected between the first power source VDD and a second power source VSS, for example, light emitting elements LD.

For example, the light emitting part EMU may include the first connection electrode ELT1 electrically connected to the first power source VDD through the pixel circuit PXC and a first power line PL1, a fifth connection electrode ELT5 electrically connected to the second power source VSS through a second power line PL2, and light emitting elements LD electrically connected between the first and fifth connection electrodes ELT1 and ELT5.

The first and second power sources VDD and VSS may have different potentials so that the light emitting elements LD may emit light. For example, the first power source VDD may be set as a high-potential power source, and the second power source VSS may be set as a low-potential power source.

In an embodiment, the light emitting part EMU may include at least one serial stage. Each serial stage may include a pair of electrodes (for example, two electrodes) and at least one light emitting element LD electrically connected in a forward direction between the pair of electrodes. The number of serial stages forming the light emitting part EMU and the number of light emitting elements LD forming each serial stage are not particularly limited. For example, the number of the light emitting elements LD configuring respective serial stages may be the same or different from each other, but the number of the light emitting elements LD is not particularly limited.

For example, the light emitting part EMU may include a first serial stage including at least one first light emitting element LD1, a second serial stage including at least one second light emitting element LD2, a third serial stage including at least one third light emitting element LD3, and a fourth serial stage including at least one fourth light emitting element LD4.

The first serial stage may include the first connection electrode ELT1, a second connection electrode ELT2, and at least one first light emitting element LD1 electrically connected between the first and second connection electrodes ELT1 and ELT2. Each first light emitting element LD1 may be electrically connected in a forward direction between the first and second connection electrodes ELT1 and ELT2. For example, the first end portion EP1 of the first light emitting element LD1 may be electrically connected to the first connection electrode ELT1, and the second end portion EP2 of the first light emitting element LD1 may be electrically connected to the second connection electrode ELT2.

The second serial stage may include the second connection electrode ELT2, a third connection electrode ELT3, and at least one second light emitting element LD2 electrically connected between the second and third connection electrodes ELT2 and ELT3. Each second light emitting element LD2 may be electrically connected in a forward direction between the second and third connection electrodes ELT2 and ELT3. For example, the first end portion EP1 of the second light emitting element LD2 may be electrically connected to the second connection electrode ELT2, and the second end portion EP2 of the second light emitting element LD2 may be electrically connected to the third connection electrode ELT3.

The third serial stage may include the third connection electrode ELT3, a fourth connection electrode ELT4, and at least one third light emitting element LD3 electrically connected between the third and fourth connection electrodes ELT3 and ELT4. Each third light emitting element LD3 may be electrically connected in a forward direction between the third and fourth connection electrodes ELT3 and ELT4. For example, the first end portion EP1 of the third light emitting element LD3 may be electrically connected to the third connection electrode ELT3, and the second end portion EP2 of the third light emitting element LD3 may be electrically connected to fourth connection electrode ELT4.

The fourth serial stage may include the fourth connection electrode ELT4, the fifth connection electrode ELT5, and at least one fourth light emitting element LD4 electrically connected between the fourth and fifth connection electrodes ELT4 and ELT5. Each fourth light emitting element LD4 may be electrically connected in a forward direction between the fourth and fifth connection electrodes ELT4 and ELT5. For example, the first end portion EP1 of the fourth light emitting element LD4 may be electrically connected to the fourth connection electrode ELT4, and the second end portion EP2 of the fourth light emitting element LD4 may be electrically connected to the fifth connection electrode ELT5.

A first electrode of the light emitting part EMU, for example, the first connection electrode ELT1 may be an anode electrode of the light emitting part EMU. A last electrode of the light emitting part EMU, for example, the fifth connection electrode ELT5 may be a cathode electrode of the light emitting part EMU.

The remaining electrodes of the light emitting part EMU, for example, the second connection electrode ELT2, the third connection electrode ELT3, and/or the fourth connection electrode ELT4, may configure respective intermediate electrodes. For example, the second connection electrode ELT2 may configure a first intermediate electrode IET1, the third connection electrode ELT3 may configure a second intermediate electrode IET2, and the fourth connection electrode ELT4 may configure a third intermediate electrode IET3.

In case that the light emitting elements LD are electrically connected in a serial/parallel structure, power efficiency may be improved compared with when the same number of light emitting elements LD are electrically connected only in parallel. In addition, in the pixel PXL in which the light emitting elements LD are electrically connected in a serial/parallel structure, even if a short circuit defect occurs at some of the serial stages, since a luminance (or a predetermined or selected luminance) may be displayed by the light emitting elements LD in the remaining serial stages, the possibility of dark spot defects of the pixel PXL may be reduced. However, the disclosure is not limited thereto, and the light emitting part EMU may be configured by electrically connected the light emitting elements LD only in series or only in parallel.

Each of the light emitting elements LD may include at least one electrode (for example, the first connection electrode ELT1), the first end portion EP1 (for example, a p-type end portion) electrically connected to the first power source VDD via the pixel circuit PXC and/or the first power line PL1, and the second end portion EP2 (for example, an n-type end portion) electrically connected to the second power source VSS via at least another electrode (for example, the fifth connection electrode ELT5) and the second power line PL2. For example, the light emitting elements LD may be electrically connected in a forward direction between the first power source VDD and the second power source VSS. The light emitting elements LD electrically connected to the forward direction may form the effective light sources of the light emitting part EMU.

In case that a driving current is supplied through the corresponding pixel circuit PXC, the light emitting elements LD may emit light with luminance corresponding to the driving current. For example, during each frame period, the pixel circuit PXC may supply a driving current corresponding to a grayscale value to be displayed in the corresponding frame to the light emitting part EMU. Accordingly, while the light emitting elements LD emit light with luminance corresponding to the driving current, the light emitting part EMU may display the luminance corresponding to the driving current.

Figure 5:
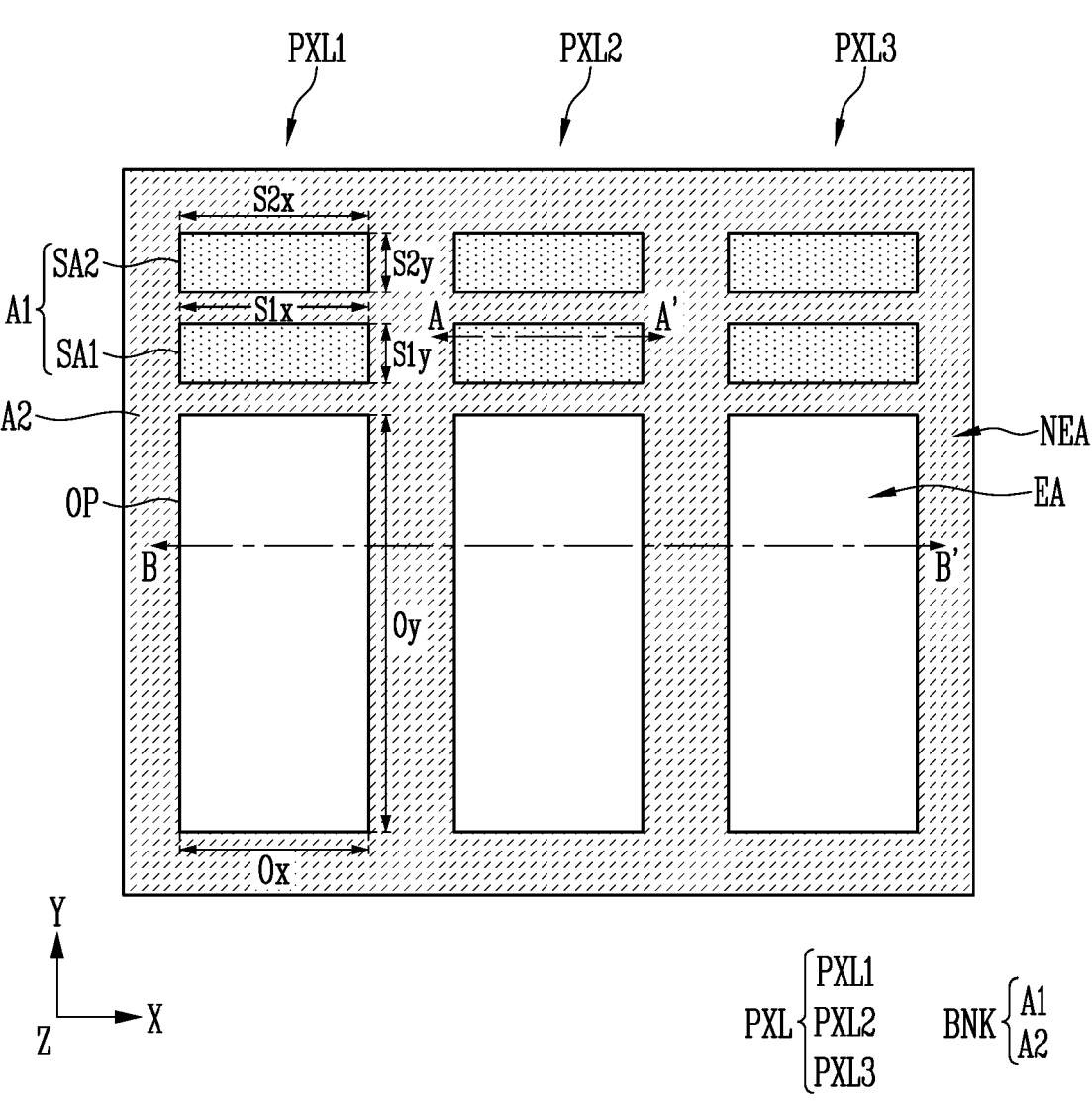
FIG. 5 and FIG. 6 illustrate schematic plan views of first to third pixels according to an embodiment.
Figure 6:
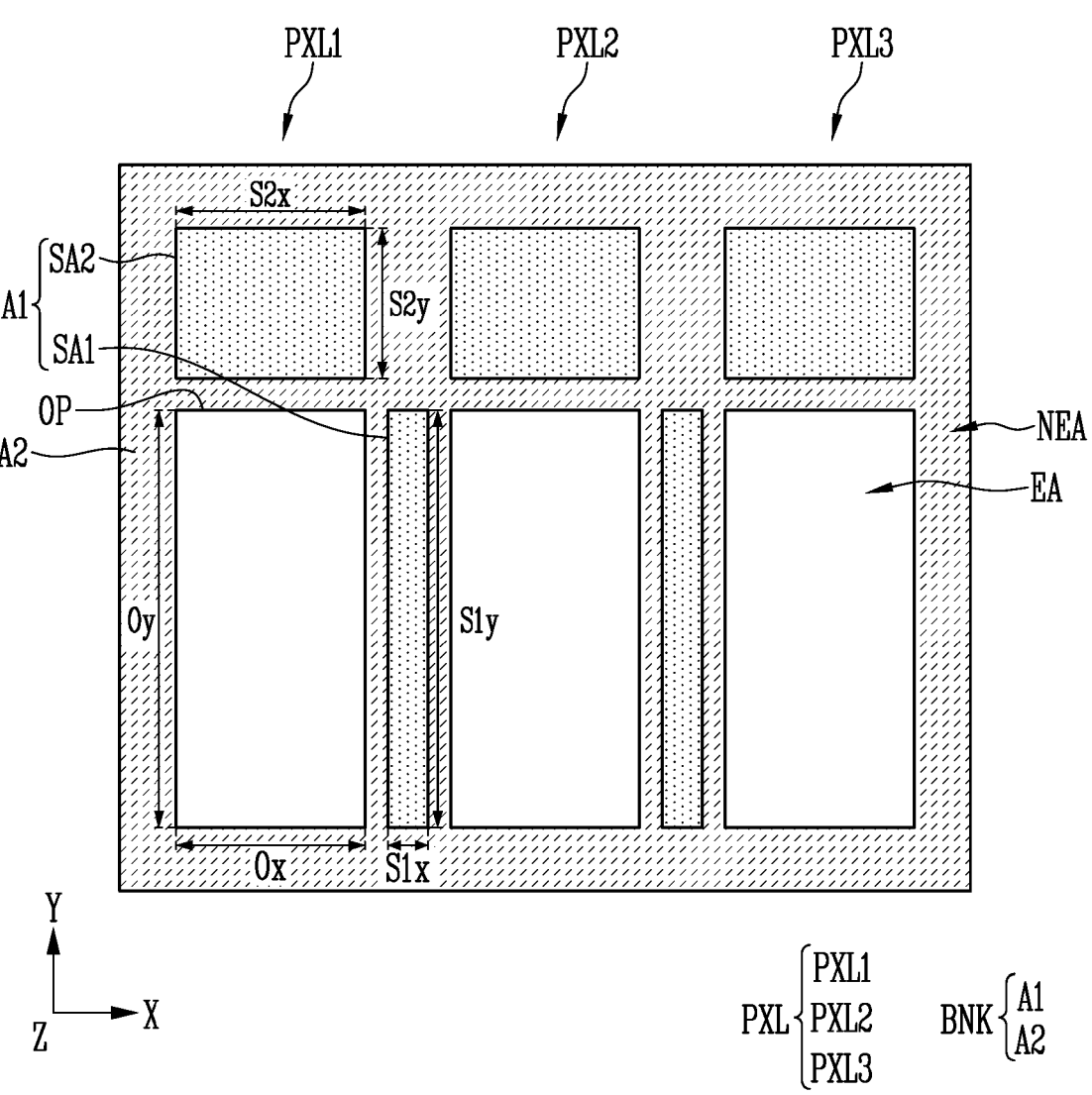
Figure 7:
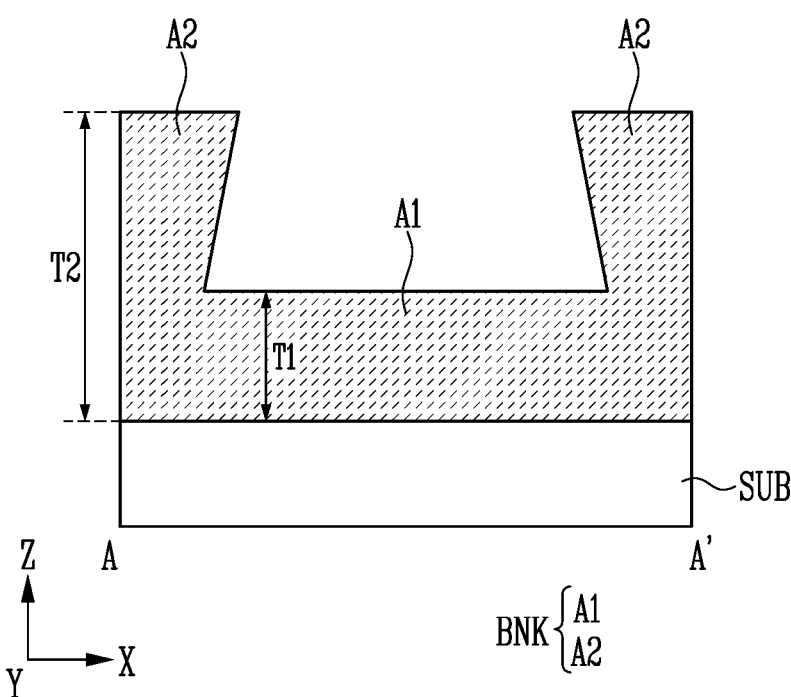
FIG. 7 illustrates a schematic cross-sectional view taken along line A-A' of FIG. 5.
Figure 8:
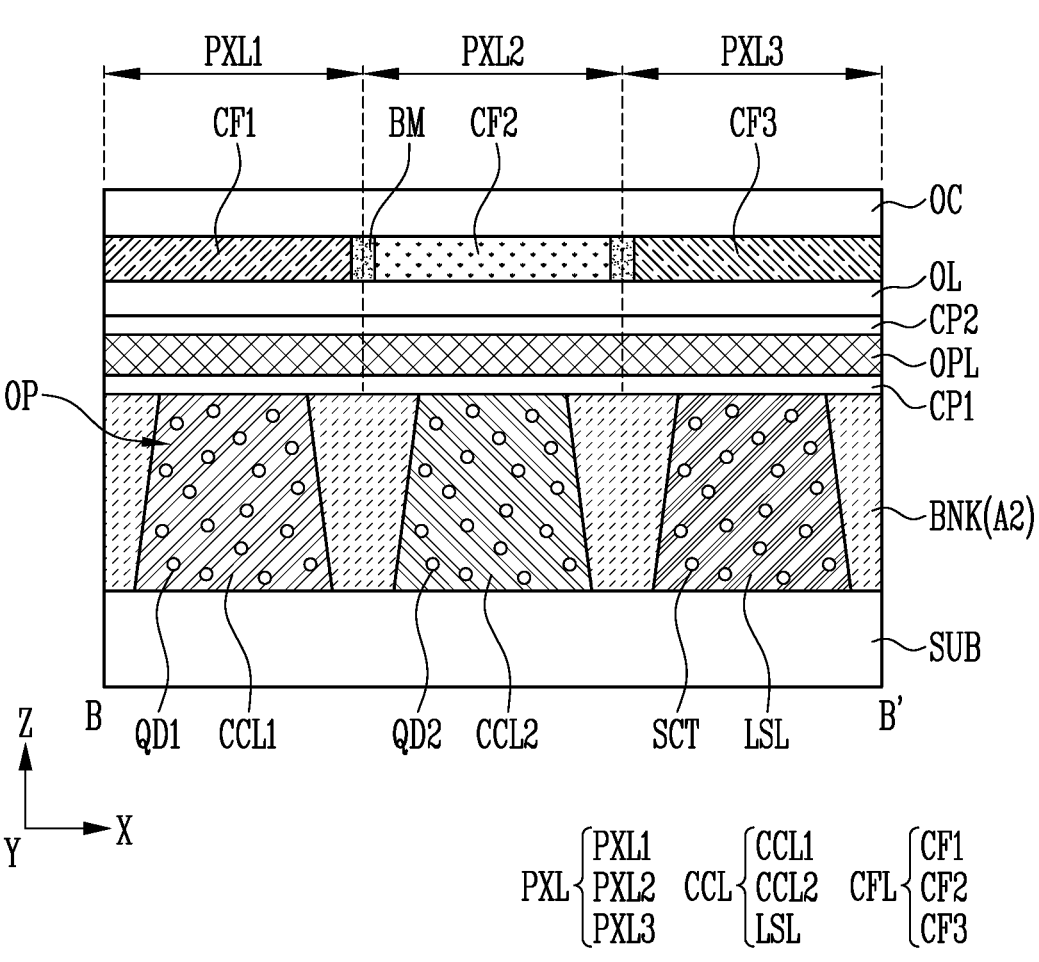
FIG. 8 illustrates a schematic cross-sectional view taken along line B-B' of FIG. 5.

FIG. 5 and FIG. 6 illustrate schematic plan views of first to third pixels according to an embodiment. FIG. 7 illustrates a schematic cross-sectional view taken along line A-A' of FIG. 5. FIG. 8 illustrates a schematic cross-sectional view taken along line B-B' of FIG. 5.

Referring to FIG. 5 and FIG. 6, each of the first to third pixels PXL1, PXL2, and PXL3 may include a light emitting area EA capable of emitting light by including light emitting elements LD. The light emitting area EA of each of the first to third pixels PXL1, PXL2, and PXL3 may be surrounded by a non-light emitting area NEA. The non-light emitting area NEA may be an area in which a bank BNK is provided.

The bank BNK may include an opening OP overlapping the light emitting area EA (e.g., in a plan view). The opening OP of the bank BNK may expose the light emitting area EA. The bank BNK may form a dam structure defining an area to which a color conversion layer CCL (see FIG. 8) is to be supplied in a step of supplying the color conversion layer CCL to the pixels PXL, which will be described below. For example, the light emitting area EA is partitioned by the opening OP of the bank BNK, so that a desired type and/or amount of the color conversion layer CCL may be supplied into the light emitting area EA.

The bank BNK may include at least one light blocking material and/or at least one reflective material. Accordingly, light leakage between adjacent pixels PXL may be prevented. For example, the bank BNK may include at least one black matrix material and/or at least one color filter material. For example, the bank BNK may be formed in a black opaque pattern that may block transmission of light. In the embodiment, a reflective film (not shown) may be formed on a surface (for example, a side wall) of the bank BNK to increase the light efficiency of each pixel PXL.

The bank BNK may include a first area A1 that is spaced apart from the opening OP. The first area A1 may provide a space that may accommodate the color conversion layer CCL overflowing from the opening OP in a process of supplying the color conversion layer CCL in the opening OP (or the light emitting area EA). Accordingly, it is possible to prevent the color conversion layer CCL provided to each pixel PXL from overflowing into the adjacent pixels PXL.

The first area A1 may include a first sub-area SA1 and a second sub-area SA2 that are spaced apart from each other. Referring to FIG. 5, the first sub-area SA1 and the second sub-area SA2 may be spaced apart from the opening OP in a second direction (Y-axis direction). For example, the opening OP, the first sub-area SA1, and the second sub-area SA2 may be sequentially arranged in the second direction (Y-axis direction).

A width $S1x$ in a first direction (X-axis direction) of the first sub-area SA1 may be substantially equal or similar to a width $S2x$ in the first direction (X-axis direction) of the second sub-area SA2. In addition, the width $S1x$ in the first direction (X-axis direction) of the first sub-area SA1 and/or the the width $S2x$ in the first direction (X-axis direction) of the second sub-area SA2 may be substantially equal or similar to a width $Ox$ in the first direction (X-axis direction) of the opening OP. In addition, a width $Sly$ in the second direction (Y-axis direction) of the first sub-area SA1 may be substantially equal or similar to a width $S2y$ in the second direction (Y-axis direction) of the second sub-area SA2. In addition, the width $Sly$ in the second direction (Y-axis direction) of the first sub-area SA1 and/or the width $S2y$ in the second direction (Y-axis direction) of the second sub-area SA2 may be different from a width $Oy$ of the second direction (Y-axis direction) of the opening OP. For example, the width $Sly$ in the second direction (Y-axis direction) of the first sub-area SA1 and/or the width $S2y$ in the second direction (Y-axis direction) of the second sub-area SA2 may be smaller than the width $Oy$ of the second direction (Y-axis direction) of the opening OP. However, the positions and sizes of the opening OP, the first sub-area SA1, and/or the second sub-area SA2 are not limited to the embodiment shown in FIG. 5, and may be variously changed.

Referring to FIG. 6, the first sub-area SA1 may be spaced apart from the opening OP in the first direction (X-axis direction), and the second sub-area SA2 may be spaced apart from the opening OP in the second direction (Y-axis direction). For example, the first sub-area SA1 may be disposed between the first to third pixels PXL1, PXL2, and PXL3.

The width $S1x$ in the first direction (X-axis direction) of the first sub-area SA1 may be different from the width $S2x$ in the first direction (X-axis direction) of the second sub-area SA2. For example, the width $S1x$ in the first direction (X-axis direction) of the first sub-area SA1 may be smaller than the width S2$x$ in the first direction (X-axis direction) of the second sub-area SA2. In addition, the width S1$x$ in the first direction (X-axis direction) of the first sub-area SA1 may be different from the width Ox in the first direction (X-axis direction) of the opening OP. For example, the width S1$x$ in the first direction (X-axis direction) of the first sub-area SA1 may be smaller than the width Ox in the first direction (X-axis direction) of the opening OP. In addition, the width S2$x$ in the first direction (X-axis direction) of the second sub-area SA2 may be substantially equal or similar to the width Ox in the first direction (X-axis direction) of the opening OP.

The width Sl$y$ in the second direction (Y-axis direction) of the first sub-area SA1 may be different from the width S2$y$ in the second direction (Y-axis direction) of the second sub-area SA2. For example, the width S1$y$ in the second direction (Y-axis direction) of the first sub-area SA1 may be greater than the width S2$y$ in the second direction (Y-axis direction) of the second sub-area SA2. In addition, the width Sy in the second direction (Y-axis direction) of the first sub-area SA1 may be substantially equal or similar to the width Oy in the second direction (Y-axis direction) of the opening OP. In addition, the width S2$y$ of the second sub-area SA2 in the second direction (Y-axis direction) may be different from the width Oy of the opening OP in the second direction (Y-axis direction). For example, the width S2$y$ in the second direction (Y-axis direction) of the second sub-area SA2 may be smaller than the width Oy in the second direction (Y-axis direction) of the opening OP. However, the positions and sizes of the opening OP, the first sub-area SA1, and/or the second sub-area SA2 are not limited to the embodiment shown in FIG. 6, and may be variously changed.

The bank BNK may include a second area A2 surrounding the opening OP and the first area A1. The first area A1 and the second area A2 may be made of a same material. For example, the first area A1 and the second area A2 may be integrally provided. The first area A1 and the second area A2 may be simultaneously formed by a same process using a halftone mask, but the disclosure is not limited thereto.

FIG. 7 illustrates a cross-section of the first area A1 and the second area A2 of the bank BNK provided in the non-light emitting area NEA. Referring to FIG. 7, the bank BNK may be disposed on the light emitting substrate SUB. A detailed description of a cross-sectional structure of the light emitting substrate SUB will be described below with reference to FIG. 10.

In the bank BNK, a thickness T2 in a third direction (Z-axis direction) of the second area A2 may be thicker (or greater) than a thickness T1 in the third direction (Z-axis direction) of the first area A1. For example, the first area A1 may partially compensate for a step (or height or thickness difference) due to the second area A2. In this case, even if a photoresist is provided on the first area A1 of the bank BNK in the subsequent process, it is possible to prevent occurrence of air bubbles due to the step in the second area A2, so It is possible to minimize a phenomenon of photo resist bursting due to the air bubbles. In other words, it is possible to improve display quality because it is possible to reduce stain defects caused by deformation and residue of the photo resist in the subsequent process. For example, in case that the thickness T2 in the third direction (Z-axis direction) of the second area A2 is formed to be about 11 μm to about 15 μm, the thickness T1 in the third direction (Z-axis direction) of the first area A1 may be formed to be about 6 μm or more, but the disclosure is not limited thereto.

In the embodiment, the bank BNK may have a reversed-tapered shape. A side surface of the bank BNK may form an obtuse angle with a surface of the light emitting substrate SUB. However, the disclosure is not limited thereto, and a cross-sectional shape of the bank BNK may be variously changed.

FIG. 8 illustrates the bank BNK, the color conversion layer CCL, an optical layer OPL, and/or a color filter layer CFL provided in the first to third pixels PXL1, PXL2, and PXL3.

Referring to FIG. 8, the second area A2 of the bank BNK may be disposed between the first to third pixels PXL1, PXL2, and PXL3 or at a boundary therebetween. The bank BNK may include the opening OP overlapping the light emitting area EA (see FIG. 5) of each of the first to third pixels PXL1, PXL2, and PXL3. The opening OP of the bank BNK may provide a space in which the color conversion layer CCL may be provided.

The bank BNK may include an organic material such as an acrylates resin, an epoxy resin, a phenolic resin, a polyamides resin, a polyimides rein, a polyesters resin, a polyphenylenesulfides resin, or a benzocyclobutene (BCB). However, the disclosure is not limited thereto, and the bank BNK may be configured as a single layer or multilayer, and may include at least one of a silicon oxide (SiO$_x$), a silicon nitride (SiN$_x$), a silicon oxynitride (SiO$_x$N$_y$), an aluminum nitride (AlN$_x$), an aluminum oxide (AlO$_x$), a zirconium oxide (ZrO$_x$), a hafnium oxide (HfO$_x$), and a titanium oxide (TiO$_x$), and various types of inorganic materials.

In some embodiments, the bank BNK may include at least one light blocking and/or at least one reflective material. Accordingly, light leakage between adjacent pixels PXL may be prevented. For example, the bank BNK may include at least one black matrix material and/or at least one color filter material. For example, the bank BNK may be formed in a black opaque pattern that may block transmission of light. In the embodiment, a reflective film (not shown) may be formed on a surface (for example, a side wall) of the bank BNK to increase the light efficiency of each pixel PXL.

The color conversion layer CCL may be disposed on the light emitting substrate SUB in addition to the light emitting elements LD within the opening OP of the bank BNK. The color conversion layer CCL may include a first color conversion layer CCL1 disposed on the first pixel PXL1, a second color conversion layer CCL2 disposed on the second pixel PXL2, and a scattering layer LSL disposed on the third pixel PXL3.

In the embodiment, the first to third pixels PXL1, PXL2, and PXL3 may include the light emitting elements LD that emit light of a same color. For example, the first to third pixels PXL1, PXL2, and PXL3 may include the light emitting elements LD that emit light of a third color (or blue color). The color conversion layer CCL including color conversion particles is disposed on the first to third pixels PXL1, PXL2, and PXL3, respectively, thereby displaying a full-color image.

The first color conversion layer CCL1 may include first color conversion particles that convert light of the third color emitted from the light emitting element LD into light of the first color. For example, the first color conversion layer CCL1 may include first quantum dots QD1 dispersed in a matrix material such as a base resin.

In the embodiment, in case that the light emitting element LD is a blue light emitting element that emits blue light and the first pixel PXL1 is a red pixel, the first color conversion layer CCL1 may include a first quantum dot QD1 that converts blue light emitted from the blue light emitting element into red light. The first quantum dot QD1 may absorb blue light to shift a wavelength according to an energy transition to emit red light. In case that the first pixel PXL1 is a pixel of a different color, the first color conversion layer CCL1 may include a first quantum dot QD1 corresponding to a color of the first pixel PXL1.

The second color conversion layer CCL2 may include second color conversion particles that convert light of the third color emitted from the light emitting element LD into light of the second color. For example, the second color conversion layer CCL2 may include second quantum dots QD2 dispersed in a matrix material such as a base resin.

In the embodiment, in case that the light emitting element LD is a blue light emitting element that emits blue light and the second pixel PXL2 is a green pixel, the second color conversion layer CCL2 may include a second quantum dot QD2 that converts blue light emitted from the blue light emitting element into green light. The second quantum dot QD2 may absorb blue light to shift a wavelength according to an energy transition to emit green light. In case that the second pixel PXL2 is a pixel of a different color, the second color conversion layer CCL2 may include the second quantum dot QD2 corresponding to a color of the second pixel PXL2.

In the embodiment, blue light having a relatively short wavelength among the visible ray bands is incident on the first quantum dot QD1 and the second quantum dot QD2, respectively, and thus an absorption coefficient of each of the first quantum dot QD1 and the second quantum dot QD2 may be increased. Accordingly, the efficiency of light emitted from the first pixel PXL1 and the second pixel PXL2 may be increased, and the desirable color reproducibility may be secured. In addition, the light emitting part EMU of the first to third pixels PXL1, PXL2, and PXL3 is configured by using the light emitting elements LD of a same color (for example, the blue color light emitting element), and thus the manufacturing efficiency of the display device may be increased.

The scattering layer LSL may be provided to efficiently use the third color (or blue color) light emitted from the light emitting element LD. For example, in case that the light emitting element LD is a blue light emitting element that emits blue light and the third pixel PXL3 is a blue pixel, the scattering layer LSL may include at least one type of scatterer SCT to efficiently use the light emitted from the light emitting element LD.

For example, the scattering layer LSL may include scatterers SCT dispersed in a matrix material such as a base resin. For example, the scattering layer LSL may include the scatterer SCT such as silica, but materials included in the scatterer SCT are not limited thereto. The scatterer SCT is not disposed only in the third pixel PXL3, and may be selectively included in the first color conversion layer CCL1 or the second color conversion layer CCL2. In some embodiments, the scatterer SCT may be omitted to provide the scattering layer LSL made of a transparent polymer.

A first capping layer CP1 may be disposed on the color conversion layer CCL. The first capping layer CP1 may be entirely disposed on the first to third pixels PXL1, PXL2, and PXL3. The first capping layer CP1 may cover (or overlap, e.g., in a plan view) the color conversion layer CCL. The first capping layer CP1 may prevent impurities such as moisture or air from penetrating from the outside to damage or contaminate the color conversion layer CCL.

The first capping layer CP1 is an inorganic layer, which may include silicon nitride ($SiN_x$), aluminum nitride ($AlN_x$), titanium nitride ($TiN_x$), silicon oxide ($SiO_x$), aluminum oxide ($AlO_x$), titanium oxide ($TiO_x$), silicon oxycarbide ($SiO_xC_y$), or silicon oxynitride ($SiO_xN_y$).

The optical layer OPL may be disposed on the first capping layer CP1. The optical layer OPL may be entirely provided on the first to third pixels PXL1, PXL2, and PXL3.

The optical layer OPL may serve to improve light extraction efficiency by recycling light provided from the color conversion layer CCL by total reflection. To this end, the optical layer OPL may have a relatively low refractive index compared to the color conversion layer CCL. For example, the refractive index of the color conversion layer CCL may be about 1.6 to about 2.0, and the refractive index of the optical layer OPL may be about 1.1 to about 1.3, but the disclosure is not limited thereto.

In some embodiments, the optical layer OPL may include a base resin and hollow particles dispersed in the base resin. The hollow particles may include hollow silica particles. In addition, the hollow particle may be a pore formed by a porogen, but the disclosure is not limited thereto. In addition, the optical layer OPL may include at least one of titanium dioxide ($TiO_2$) particles and nano silicate particles, but the disclosure is not limited thereto.

A second capping layer CP2 may be disposed on the optical layer OPL. The second capping layer CP2 may be entirely disposed on the first to third pixels PXL1, PXL2, and PXL3. The second capping layer CP2 may cover the optical layer OPL. The second capping layer CP2 may prevent impurities such as moisture or air from penetrating from the outside to damage or contaminate the optical layer OPL.

The second capping layer CP2 is an inorganic layer, which may include silicon nitride ($SiN_x$), aluminum nitride ($AlN_x$), titanium nitride ($TiN_x$), silicon oxide ($SiO_x$), aluminum oxide ($AlO_x$), titanium oxide ($TiO_x$), silicon oxycarbide ($SiO_xC_y$), or silicon oxynitride ($SiO_xN_y$).

A planarization layer OL may be disposed on the second capping layer CP2. The planarization layer OL may be entirely provided in the first to third pixels PXL1, PXL2, and PXL3.

The planarization layer OL may include an organic material such as an acrylates resin, an epoxy resin, a phenolic resin, a polyamides resin, a polyimides rein, a polyesters resin, a polyphenylenesulfides resin, or a benzocyclobutene (BCB). However, the disclosure is not limited thereto, and the planarization layer OL may include at least one of a silicon oxide ($SiO_x$), a silicon nitride ($SiN_x$), a silicon oxynitride ($SiO_xN_y$), an aluminum nitride ($AlN_x$), an aluminum oxide ($AlO_x$), a zirconium oxide ($ZrO_x$), a hafnium oxide ($HfO_x$), and a titanium oxide ($TiO_x$), and various types of inorganic materials.

The color filter layer CFL may be disposed on the planarization layer OL. The color filter layer CFL may include color filters CF1, CF2, and CF3 matching the color of each pixel PXL. A full-color image may be displayed by disposing the color filters CF1, CF2, and CF3 matching respective colors of the first to third pixels PXL1, PXL2, and PXL3.

The color filter layer CFL may include a first color filter CF1 that is disposed in the first pixel PXL1 to selectively transmit light emitted by the first pixel PXL1, a second color filter CF2 that is disposed in the second pixel PXL2 to selectively transmit light emitted by the second pixel PXL2, and a third color filter CF3 that is disposed in the third pixel PXL3 to selectively transmit light emitted by the third pixel PXL3.

In the embodiment, the first color filter CF1, the second color filter CF2, and the third color filter CF3 may be a red color filter, a green color filter, and a blue color filter, respectively, but the disclosure is not limited thereto. Hereinafter, in case that one of the first color filter CF1, the second color filter CF2, and the third color filter CF3 is referred to, or in case that two or more thereof are comprehensively referred to, it will be referred to as the "color filter CF" or "color filters CF".

The first color filter CF1 may overlap the light emitting substrate SUB (or light emitting element LD) of the first pixel PXL1 and the first color conversion layer CCL1 in the third direction (Z-axis direction). The first color filter CF1 may include a color filter material that selectively transmits light of a first color (or red color). For example, in case that the first pixel PXL1 is a red pixel, the first color filter CF1 may include a red color filter material.

The second color filter CF2 may overlap the light emitting substrate SUB (or light emitting element LD) of the second pixel PXL2 and the second color conversion layer CCL2 in the third direction (Z-axis direction). The second color filter CF2 may include a color filter material that selectively transmits light of a second color (or green color). For example, in case that the second pixel PXL2 is a green pixel, the second color filter CF2 may include a green color filter material.

The third color filter CF3 may overlap the light emitting substrate SUB (or light emitting element LD) and the scattering layer LSL of the third pixel PXL3 in the third direction (Z-axis direction). The third color filter CF3 may include a color filter material that selectively transmits light of a third color (or blue color). For example, in case that the third pixel PXL3 is a blue pixel, the third color filter CF3 may include a blue color filter material.

In some embodiments, a light blocking layer BM may be further disposed between the first to third color filters CF1, CF2, and CF3 or at a boundary therebetween. Thus, in case that the light blocking layer BM is formed between the first to third color filters CF1, CF2, and CF3, it is possible to prevent a color mixing defect viewed from a front or side of a display device. The material of the light blocking layer BM is not particularly limited, and may be made of various light blocking materials. For example, the light blocking layer BM may be formed by stacking the first to third color filters CF1, CF2, and CF3 on each other.

An overcoat layer OC may be disposed on the color filter layer CFL. The overcoat layer OC may be entirely provided in the first to third pixels PXL1, PXL2, and PXL3. The overcoat layer OC may cover the color filter layer CFL and lower members disposed therebelow. The overcoat layer OC may prevent moisture or air from penetrating into the above-mentioned lower members that are disposed therebelow. In addition, the overcoat layer OC may protect the above-mentioned lower members from foreign matters such as dust.

The overcoat layer OC may include an organic material such as an acrylates resin, an epoxy resin, a phenolic resin, a polyamides resin, a polyimides rein, a polyesters resin, a polyphenylenesulfides resin, or a benzocyclobutene (BCB). However, the disclosure is not limited thereto, and the overcoat layer OC may include at least one of a silicon oxide $(SiO_x)$, a silicon nitride $(SiN_x)$, a silicon oxynitride $(SiO_xN_y)$, an aluminum nitride $(AlN_x)$, an aluminum oxide $(AlO_x)$, a zirconium oxide $(ZrO_x)$, a hafnium oxide $(HfO_x)$, and a titanium oxide $(TiO_x)$, and various types of inorganic materials.

Figure 9:
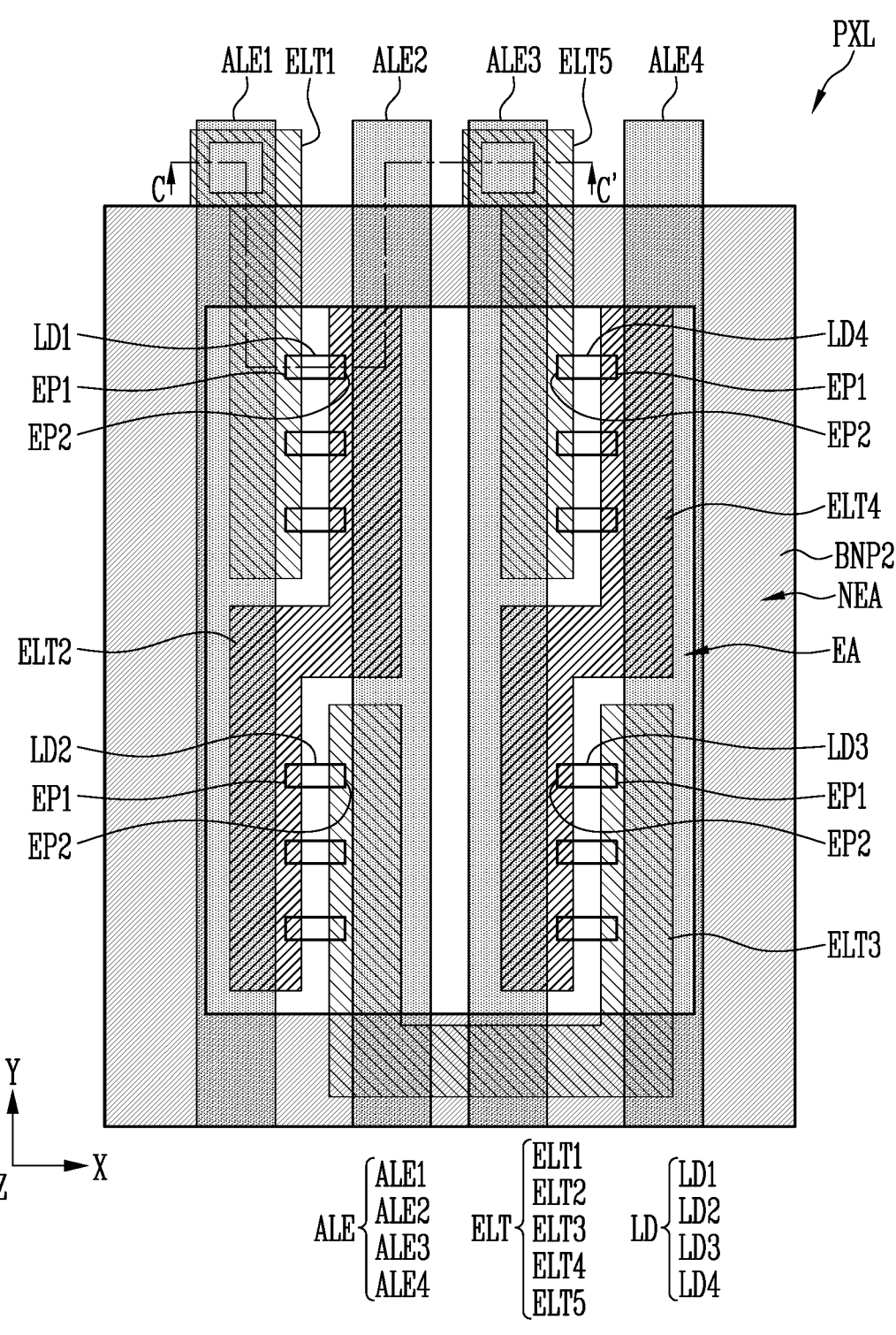
FIG. 9 illustrates a schematic plan view of a pixel according to an embodiment.
Figure 10:
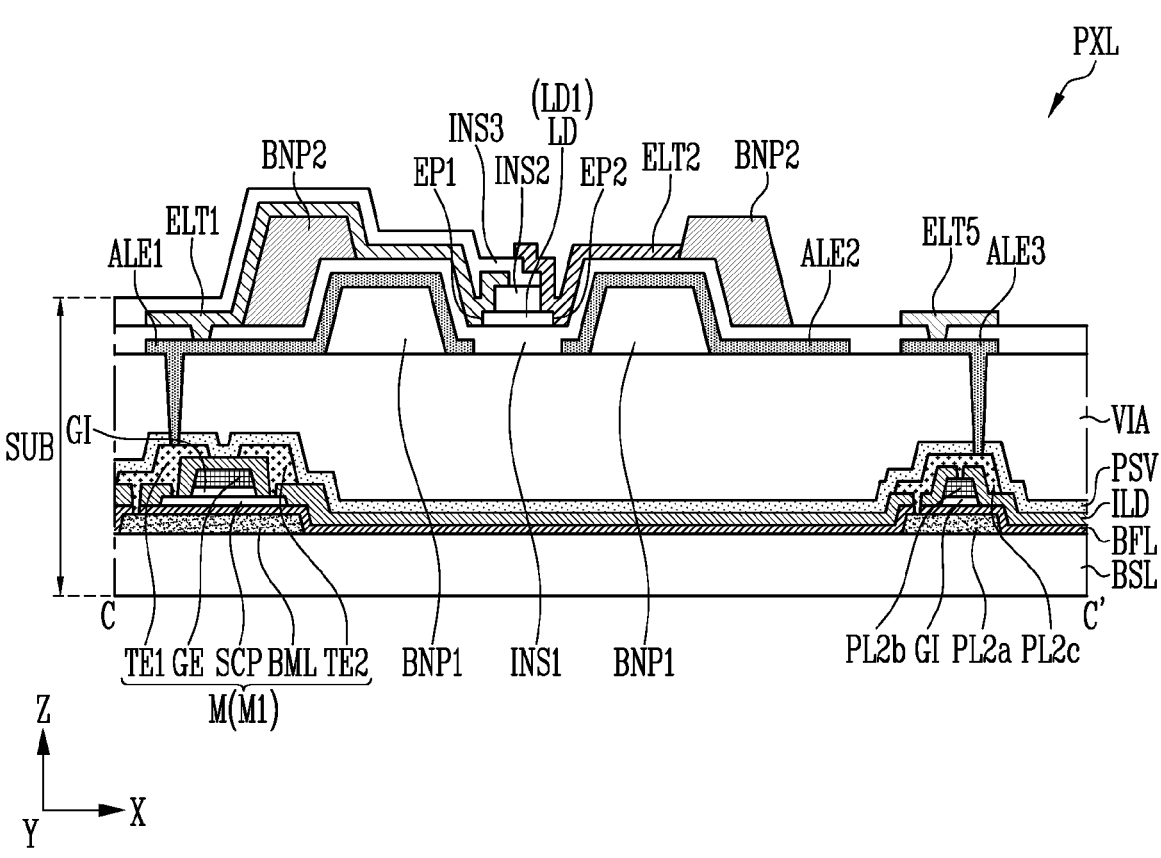
FIG. 10 illustrates a schematic cross-sectional view taken along line C-C' of FIG. 9.

FIG. 9 illustrates a schematic plan view of a pixel according to an embodiment. FIG. 10 illustrates a schematic cross-sectional view taken along line C-C' of FIG. 9.

As an example, FIG. 9 may be one of the first to third pixels PXL1, PXL2, and PXL3 configuring the pixel part PXU of FIG. 3, and the first to third pixels PXL1, PXL2, and PXL3 may be substantially a same or similar to each other. In addition, FIG. 9 illustrates the embodiment in which each pixel PXL includes the light emitting elements LD disposed in the four serial stages as shown in FIG. 4, but the number of serial stages of each pixel PXL may be variously changed according to embodiments.

Hereinafter, in case that at least one light emitting element among first to fourth light emitting elements LD1, LD2, LD3, and LD4 is arbitrarily referred to, or two or more light emitting elements are comprehensively referred to, it or they will be referred to as a "light emitting element LD" or "light emitting elements LD". In addition, in case that at least one of electrodes including first to fourth electrodes ALE1, ALE2, ALE3, and ALE4 is arbitrarily referred to, it or they will be referred to as an "electrode ALE" or "electrodes ALE", and in case that at least one of electrodes including first to fifth connection electrodes ELT1, ELT2, ELT3, ELT4, and ELT5 is arbitrarily referred to, it or they will be referred to as a "connection electrode ELT" or "connection electrodes ELT".

Referring to FIG. 9, each pixel PXL may include the light emitting area EA and the non-light emitting area NEA. The light emitting area EA may be an area that may emit light by including the light emitting elements LD. The non-light emitting area NEA may be disposed to surround the light emitting area EA. The non-light emitting area NEA may be an area in which a second bank pattern BNP2 surrounding the light emitting area EA is provided. For example, the second bank pattern BNP2 may be disposed to at least partially overlap (e.g., in a plan view) the bank BNK described with reference to FIG. 5.

Each pixel PXL may include electrodes ALE, light emitting elements LD, and/or connection electrodes ELT. The electrodes ALE may be provided in at least light emitting area EA. The electrodes ALE may extend in the second direction (Y-axis direction), and may be spaced apart from each other in the first direction (X-axis direction). The electrodes ALE may extend from the light emitting area EA to the non-light emitting area NEA. For example, the first to fourth electrodes ALE1, ALE2, ALE3, and ALE4 may extend in the second direction (Y-axis direction), and may be spaced apart from each other in the first direction (X-axis direction) to be sequentially disposed.

Some of the electrodes ALE may be electrically connected to the pixel circuit PXC (see FIG. 4) and/or a power line through a contact hole. For example, the first electrode ALE1 may be electrically connected to the pixel circuit PXC and/or the first power line PL1 through the contact hole, and the third electrode ALE3 may be electrically connected to the second power line PL2 through the contact hole.

In some embodiments, some of the electrodes ALE may be electrically connected to some of the connection electrodes ELT through a contact hole. For example, the first electrode ALE1 may be electrically connected to the first connection electrode ELT1 through the contact hole, and the third electrode ALE3 may be electrically connected to the fifth connection electrode ELT5 through the contact hole.

A pair of electrodes ALE adjacent to each other may receive different signals in an alignment step of the light emitting elements LD. For example, in case that the first to fourth electrodes ALE1, ALE2, ALE3, and ALE4 are sequentially arranged in the first direction (X-axis direction) in the light emitting area EA, the first and second electrodes ALE1 and ALE2 may form a pair to receive different alignment signals, and the third and fourth electrodes ALE3 and ALE4 may form a pair to receive different alignment signals.

In the embodiment, the second and third electrodes ALE2 and ALE3 may receive a same signal in the alignment step of the light emitting elements LD. FIG. 9 illustrates that the second and third electrodes ALE2 and ALE3 are separated from each other, but the second and third electrodes ALE2 and ALE3 may be integrally or non-integrally electrically connected to each other in the alignment step of the light emitting elements LD.

In some embodiments, first bank patterns BNP1 (see FIG. 10) may be disposed under the electrodes ALE. The first bank patterns BNP1 may be provided in at least light emitting area EA. The first bank patterns BNP1 may extend in a second direction (Y-axis direction), and may be spaced apart from each other in a first direction (X-axis direction).

As the first bank patterns BNP1 are provided under an area of each of the electrodes ALE, an area of each of the electrodes ALE in areas in which the first bank patterns BNP1 are formed may protrude in an upward direction of the pixel PXL, that is, a third direction (Z-axis direction). In case that the first bank patterns BNP1 and/or electrodes ALE include a reflective material, a reflective wall structure may be formed around the light emitting elements LD. Accordingly, as light emitted from the light emitting elements LD may be directed in an upward direction (for example, a front direction of the display panel PNL including a viewing angle range (e.g., a predetermined or selected viewing angle range) of the pixel PXL, light emission efficiency of the pixel PXL may be improved.

Each of the light emitting elements LD may be aligned between a pair of electrodes ALE in the light emitting area EA. In addition, each of the light emitting elements LD may be electrically connected between a pair of connection electrodes ELT.

The first light emitting element LD1 may be aligned between the first and second electrodes ALE1 and ALE2. The first light emitting element LD1 may be electrically connected between the first and second electrodes ELT1 and ELT2. As an example, the first light emitting element LD1 may be aligned in a first area (for example, an upper end area) of the first and second electrodes ALE1 and ALE2, and the first end portion EP1 of the first light emitting element LD1 may be electrically connected to the first connection electrode ELT1, and the second end portion EP2 of the first light emitting element LD1 may be electrically connected to the second connection electrode ELT2.

The second light emitting element LD2 may be aligned between the first and second electrodes ALE1 and ALE2. The second light emitting element LD2 may be electrically connected between the second and third connection electrodes ELT2 and ELT3. As an example, the second light emitting element LD2 may be aligned in a second area (for example, a lower end area) of the first and second electrodes ALE1 and ALE2, and the first end portion EP1 of the second light emitting element LD2 may be electrically connected to the second connection electrode ELT2, and the second end portion EP2 of the second light emitting element LD2 may be electrically connected to the third connection electrode ELT3.

The third light emitting element LD3 may be aligned between the third and fourth electrodes ALE3 and ALE4. The third light emitting element LD3 may be electrically connected between the third and fourth connection electrodes ELT3 and ELT4. As an example, the third light emitting element LD3 may be aligned in a second area (for example, a lower end area) of the third and fourth electrodes ALE3 and ALE4, and the first end portion EP1 of the third light emitting element LD3 may be electrically connected to the third connection electrode ELT3, and the second end portion EP2 of the third light emitting element LD3 may be electrically connected to the fourth connection electrode ELT4.

The fourth light emitting element LD4 may be aligned between the third and fourth electrodes ALE3 and ALE4. The fourth light emitting element LD4 may be electrically connected between the fourth and fifth connection electrodes ELT4 and ELT5. As an example, the fourth light emitting element LD4 may be aligned in a first area (for example, an upper end area) of the third and fourth electrodes ALE3 and ALE4, and the first end portion EP1 of the fourth light emitting element LD4 may be electrically connected to the fourth connection electrode ELT4, and the second end portion EP2 of the fourth light emitting element LD4 may be electrically connected to the fifth connection electrode ELT5.

For example, the first light emitting element LD1 may be disposed in an upper left area of the light emitting area EA, and the second light emitting element LD2 may be disposed in a lower left area of the light emitting area EA. The third light emitting element LD3 may be disposed in a lower right area of the light emitting area EA, and the fourth light emitting element LD4 may be disposed in an upper right area of the light emitting area EA. However, the arrangement and/or connection structure of the light emitting elements LD may be variously changed depending on the structure of the light emitting part EMU and/or the number of serial stages.

Each of the connection electrodes ELT may be at least provided in the light emitting area EA, and may be disposed to overlap at least one electrode ALE and/or at least one light emitting element LD. For example, each of the electrodes ELT may be formed on the electrodes ALE and/or the light emitting elements LD so as to overlap the electrodes ALE and/or the light emitting elements LD to be electrically connected to the light emitting elements LD.

The first connection electrode ELT1 may be disposed on the first area (for example, the upper end area) of the first electrode ALE1 and the first end portions EP1 of the first light emitting elements LD1 to be electrically connected to the first end portions EP1 of the first light emitting elements LD1.

The second connection electrode ELT2 may be disposed on the first area (for example, the upper end area) of the second electrode ALE2 and the second end portions EP2 of the first light emitting elements LD1 to be electrically connected to the second end portions EP2 of the first light emitting elements LD1. In addition, the second connection electrode ELT2 may be disposed on the second area (for example, the lower end area) of the first electrode ALE1 and the first end portions EP1 of the second light emitting elements LD2 to be electrically connected to the first end portions EP1 of the second light emitting elements LD2. For example, the second connection electrode ELT2 may electrically connect the second end portions EP2 of the first light emitting elements LD1 to the first end portions EP1 of the second light emitting elements LD2 in the light emitting area EA. To this end, the second connection electrode ELT2 may have a curved shape. For example, the second connection electrode ELT2 may have a curved or bent structure at a boundary between an area in which at least one first light emitting element LD1 is arranged and an area in which at least one second light emitting element LD2 is arranged.

The third connection electrode ELT3 may be disposed on the second area (for example, the lower end area) of the second electrode ALE2 and the second end portions EP2 of the second light emitting elements LD2 to be electrically connected to the second end portions EP2 of the second light emitting elements LD2. In addition, the third connection electrode ELT3 may be disposed on the second area (for example, the lower end area) of the fourth electrode ALE4 and the first end portions EP1 of the third light emitting elements LD3 to be electrically connected to the first end portions EP1 of the third light emitting elements LD3. For example, the third connection electrode ELT3 may electrically connect the second end portions EP2 of the second light emitting elements LD2 to the first end portions EP1 of the third light emitting elements LD3 in the light emitting area EA. To this end, the third connection electrode ELT3 may have a curved shape. For example, the third connection electrode ELT3 may have a curved or bent structure at a boundary between an area in which at least one second light emitting element LD2 is arranged and an area in which at least one third light emitting element LD3 is arranged.

The fourth connection electrode ELT4 may be disposed on the second area (for example, the lower end area) of the third electrode ALE3 and the second end portions EP2 of the third light emitting elements LD3 to be electrically connected to the second end portions EP2 of the third light emitting elements LD3. In addition, the fourth connection electrode ELT4 may be disposed on the first area (for example, the upper end area) of the fourth electrode ALE4 and the first end portions EP1 of the fourth light emitting elements LD4 to be electrically connected to the first end portions EP1 of the fourth light emitting elements LD4. For example, the fourth connection electrode ELT4 may electrically connect the second end portions EP2 of the third light emitting elements LD3 to the first end portions EP1 of the fourth light emitting elements LD4 in the light emitting area EA. To this end, the fourth connection electrode ELT4 may have a curved shape. For example, the fourth connection electrode ELT4 may have a curved or bent structure at a boundary between an area in which at least one third light emitting element LD3 is arranged and an area in which at least one fourth light emitting element LD4 is arranged.

The fifth connection electrode ELT5 may be disposed on the first area (for example, the upper end area) of the third electrode ALE3 and the second end portions EP2 of the fourth light emitting elements LD4 to be electrically connected to the second end portions EP2 of the fourth light emitting elements LD4.

According to the above-described manner, the light emitting elements LD arranged between the electrodes ALE may be electrically connected in a desired shape by using the connection electrodes ELT. For example, the first light emitting elements LD1, the second light emitting elements LD2, the third light emitting elements LD3, and the fourth light emitting elements LD4 may be sequentially electrically connected in series by using the connection electrodes ELT.

Hereinafter, a cross-sectional structure of each pixel PXL will be described in detail with reference to FIG. 10, focusing on the light emitting element LD. FIG. 10 illustrates the light emitting substrate SUB of the pixel PXL. FIG. 10 illustrates the first transistor M1 among various circuit elements configuring the pixel circuit PXC (see FIG. 4), and in case that it is not required to separately denote the first to third transistors M1, M2, and M3, they will be comprehensively referred to a "transistor M". Structures of the transistors M and/or a position of each layer thereof are not limited to the embodiments shown in FIG. 10, and may be variously changed according to embodiments.

Referring to FIG. 10, the light emitting substrate SUB of pixels PXL according to the embodiment may include circuit elements including the transistors M disposed on a base layer BSL, and various wires electrically connected thereto. The electrodes ALE, the light emitting elements LD, and/or the connection electrodes ELT configuring the light emitting part EMU may be disposed on the circuit elements.

The base layer BSL configures a base member, and may be a rigid or flexible substrate or film. For example, the base layer BSL may be a hard substrate made of glass or tempered glass, a flexible substrate (or a thin film) made of a plastic or metallic material, or at least one insulation layer. The material and/or physical properties of the base layer BSL are not particularly limited. In the embodiment, the base layer BSL may be substantially transparent. The "substantially transparent" may mean that light may be transmitted at a transmittance (e.g., a predetermined or selected transmittance or more). In an embodiment, the base layer BSL may be translucent or opaque. In addition, the base layer BSL may include a reflective material according to an embodiment.

A lower conductive layer BML and a first power conductive layer PL2a may be disposed on the base layer BSL. The lower conductive layer BML and the first power conductive layer PL2a may be disposed on a same layer. For example, the lower conductive layer BML and the first power conductive layer PL2a may be simultaneously formed in a same process, but the disclosure is not limited thereto. The first power conductive layer PL2a may configure the second power line PL2 described with reference to FIG. 4 and the like.

Each of the lower conductive layer BML and the first power conductive layer PL2a may be formed as a single layer or multilayer made of (or including) molybdenum (Mo), copper (Cu), aluminum (Al), chromium (Cr), gold (Au), titanium (Ti), nickel (Ni), neodymium (Nd), or indium (In), tin (Sn), or an alloy thereof.

A buffer layer BFL may be disposed on the lower conductive layer BML and the first power conductive layer PL2a. The buffer layer BFL may prevent impurities from diffusing into the circuit element. The buffer layer BFL may be formed as a single layer, but may also be formed as a multilayer of at least double layers or more. In case that the buffer layer BFL is formed as the multilayer, respective layers thereof may be made of a same material or different materials.

A semiconductor pattern SCP may be disposed on the buffer layer BFL. For example, the semiconductor pattern SCP may include a first area contacting a first transistor electrode TE1, a second area contacting a second transistor electrode TE2, and a channel area disposed between the first and second areas. In some embodiments, one of the first and second areas may be a source area, and the other thereof may be a drain area.

In some embodiments, the semiconductor pattern SCP may be made of polysilicon, amorphous silicon, an oxide semiconductor, or the like. In addition, the channel area of the semiconductor pattern SCP may be an intrinsic semiconductor as a semiconductor pattern that is not doped with impurities, and each of the first and second areas of the semiconductor pattern SCP may be a semiconductor doped with impurities.

A gate insulation layer GI may be disposed on the buffer layer BFL and the semiconductor pattern SCP. For example, the gate insulation layer GI may be disposed between the semiconductor pattern SCP and a gate electrode GE. In addition, the gate insulation layer GI may be disposed between the buffer layer BFL and a second power conductive layer PL2$b$. The gate insulation layer GI may be configured as a single layer or a multilayer, and may include at least one of a silicon oxide (SiO$_x$), a silicon nitride (SiN$_x$), a silicon oxynitride (SiO$_x$N$_y$), an aluminum nitride (AlN$_x$), an aluminum oxide (AlO$_x$), a zirconium oxide (ZrO$_x$), a hafnium oxide (HfO$_x$), and a titanium oxide (TiO$_x$), and various types of inorganic materials.

The gate electrode GE of the transistor M and the second power conductive layer PL2$b$ may be disposed on the gate insulation layer GI. The gate electrode GE and the second power conductive layer PL2$b$ may be disposed on a same layer. For example, the gate electrode GE and the second power conductive layer PL2$b$ may be simultaneously formed in a same process, but the disclosure is not limited thereto. The gate electrode GE may be disposed on the gate insulation layer GI to overlap the semiconductor pattern SCP in the third direction (Z-axis direction). The second power conductive layer PL2$b$ may be disposed on the gate insulation layer GI to overlap the first power conductive layer PL2$a$ in the third direction (Z-axis direction). The second power conductive layer PL2$b$ together with the first power conductive layer PL2$a$ may configure the second power line PL2 described with reference to FIG. 4 and the like.

Each of the gate electrode GE and the second power conductive layer PL2$b$ may be formed as a single layer or multilayer made of at least one of titanium (Ti), copper (Cu), molybdenum (Mo), chromium (Cr), gold (Au), nickel (Ni), indium (In), tin (Sn), or neodymium (Nd) or an alloy thereof. For example, each of the gate electrode GE and the second power conductive layer PL2$b$ may be formed as a multilayer in which titanium (Ti), copper (Cu), and/or an indium tin oxide (ITO) are sequentially or repeatedly stacked.

An interlayer insulation layer ILD may be disposed on the gate electrode GE and the second power conductive layer PL2$b$. For example, the interlayer insulation layer ILD may be disposed between the gate electrode GE and the first and second transistor electrodes TE1 and TE2. In addition, the interlayer insulation layer ILD may be disposed between the second power conductive layer PL2$b$ and a third power conductive layer PL2$c$.

The interlayer insulation layer ILD may be configured as a single layer or multilayer, and may include at least one of a silicon oxide (SiO$_x$), a silicon nitride (SiN$_x$), a silicon oxynitride (SiO$_x$N$_y$), an aluminum nitride (AlN$_x$), an aluminum oxide (AlO$_x$), a zirconium oxide (ZrO$_x$), a hafnium oxide (HfO$_x$), and a titanium oxide (TiO$_x$), and various types of inorganic materials.

The first and second transistor electrodes TE1 and TE2 of the transistor M and the third power conductive layer PL2$c$ may be disposed on the interlayer insulation layer ILD. The first and second transistor electrodes TE1 and TE2 and the third power conductive layer PL2$c$ may be disposed on a same layer. For example, the first and second transistor electrodes TE1 and TE2 and the third power conductive layer PL2$c$ may be simultaneously formed in a same process, but the disclosure is not limited thereto.

The first and second transistor electrodes TE1 and TE2 may be disposed to overlap the semiconductor pattern SCP in the third direction (Z-axis direction). The first and second transistor electrodes TE1 and TE2 may be electrically connected to the semiconductor pattern SCP. For example, the first transistor electrode TE1 may be electrically connected to the first area of the semiconductor pattern SCP through a contact hole penetrating the interlayer insulation layer ILD. In addition, the first transistor electrode TE1 may be electrically connected to the lower conductive layer BML through a contact hole penetrating the interlayer insulation layer ILD and the buffer layer BFL. The second transistor electrode TE2 may be electrically connected to the second area of the semiconductor pattern SCP through a contact hole penetrating the interlayer insulation layer ILD. In some embodiments, one of the first and second transistor electrodes TE1 and TE2 may be a source electrode, and the other thereof may be a drain electrode.

The third power conductive layer PL2$c$ may be disposed to overlap the first power conductive layer PL2$a$ and/or the second power conductive layer PL2$b$ in the third direction (Z-axis direction). The third power conductive layer PL2$c$ may be electrically connected to the first power conductive layer PL2$a$ and/or the second power conductive layer PL2$b$. For example, the third power conductive layer PL2$c$ may be electrically connected to the first power conductive layer PL2$a$ through a contact hole penetrating the interlayer insulation layer ILD and the buffer layer BFL. In addition, the third power conductive layer PL2$c$ may be electrically connected to the second power conductive layer PL2$b$ through a contact hole penetrating the interlayer insulation layer ILD. The third power conductive layer PL2$c$ together with the first power conductive layer PL2$a$ and/or the second power conductive layer PL2$b$ may configure the second power line PL2 described with reference to FIG. 4 and the like.

The first and second transistor electrodes TE1 and TE2 and the third power conductive layer PL2$c$ may be formed as a single layer or multilayer made of aluminum (Al), molybdenum (Mo), chromium (Cr), gold (Au), titanium (Ti), nickel (Ni), neodymium (Nd), indium (In), or tin (Sn), or an alloy thereof.

A passivation layer PSV may be disposed on the first and second transistor electrodes TE1 and TE2 and the third power conductive layer PL2$c$. The passivation layer PSV may be configured as a single layer or multilayer, and may include at least one of a silicon oxide (SiO$_x$), a silicon nitride (SiN$_x$), a silicon oxynitride (SiO$_x$N$_y$), an aluminum nitride (AlN$_x$), an aluminum oxide (AlO$_x$), a zirconium oxide (ZrO$_x$), a hafnium oxide (HfO$_x$), and a titanium oxide (TiO$_x$), and various types of inorganic materials.

A via layer VIA may be disposed on the passivation layer PSV. The via layer VIA may be made of an organic material to flatten a step therebelow. For example, the via layer VIA may include an organic material such as an acrylates resin, an epoxy resin, a phenolic resin, a polyamides resin, a polyimides resin, a polyesters resin, a polyphenylenesulfides resin, or a benzocyclobutene (BCB). However, the disclosure is not limited thereto, and the via layer VIA may include at least one of a silicon oxide (SiO$_x$), a silicon nitride (SiN$_x$), a silicon oxynitride (SiO$_x$N$_y$), an aluminum nitride (AlN$_x$), an aluminum oxide (AlO$_x$), a zirconium oxide (ZrO$_x$), a hafnium oxide (HfO$_x$), and a titanium oxide (TiO$_x$), and various types of inorganic materials.

The first bank patterns BNP1 may be disposed on the via layer VIA. The first bank patterns BNP1 may have various shapes according to embodiments. In the embodiment, the first bank patterns BNP1 may have a shape protruding in the third direction (Z-axis direction) on the base layer BSL. In addition, the first bank patterns BNP1 may be formed to have an inclined surface inclined at an angle (e.g., a predetermined or selected angle) with respect to the base layer BSL. However, the disclosure is not limited thereto, and the first bank patterns BNP1 may have a side wall having a curved surface or a step shape. For example, the first bank patterns BNP1 may have a cross-section of a semi-circular or semi-elliptical shape.

Electrodes and insulation layers disposed at an upper portion of the first bank patterns BNP1 may have a shape corresponding to the first bank patterns BNP1. As an example, the electrodes ALE disposed on the first bank patterns BNP1 may include an inclined surface or a curved surface having a shape corresponding to the shape of the first bank patterns BNP. Accordingly, the first bank patterns BNP1, along with the electrodes ALE provided thereon, may function as a reflective member that guides the light emitted from the light emitting elements LD in a front direction of the pixel PXL, for example, the third direction (Z-axis direction), to improve the light emitting efficiency of the display panel PNL.

The first bank patterns BNP1 may include at least one organic and/or inorganic material. For example, the first bank patterns BNP1 may include an organic material such as an acrylates resin, an epoxy resin, a phenolic resin, a polyamides resin, a polyimides rein, a polyesters resin, a polyphenylenesulfides resin, or a benzocyclobutene (BCB). However, the disclosure is not limited thereto, and the first bank patterns BNP1 may be configured as a single layer or multilayer, and may include at least one of a silicon oxide ($SiO_x$), a silicon nitride ($SiN_x$), a silicon oxynitride ($SiO_xN_y$), an aluminum nitride ($AlN_x$), an aluminum oxide ($AlO_x$), a zirconium oxide ($ZrO_x$), a hafnium oxide ($HfO_x$), or a titanium oxide ($TiO_x$), and various types of inorganic materials.

The electrodes ALE may be disposed on the via layer VIA and the first bank patterns BNP1. The electrodes ALE may be disposed in the pixel PXL to be spaced apart from each other. The electrodes ALE may be disposed on a same layer. For example, the electrodes ALE may be simultaneously formed in a same process, but the disclosure is not limited thereto.

The electrodes ALE may receive an alignment signal in the alignment step of the light emitting elements LD. Accordingly, an electric field is formed between the electrodes ALE so that the light emitting elements LD provided in each pixel PXL may be aligned between the electrodes ALE.

The electrodes ALE may include at least one conductive material. For example, the electrodes ALE may include at least one metal of various metal materials including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), and copper (Cu), or an alloy including the same, a conductive oxide such as an indium tin oxide (ITO), an indium zinc oxide (IZO), an indium tin zinc Oxide (ITZO), an aluminum zinc oxide (AZO), a gallium zinc oxide (GZO), a zinc tin oxide (ZTO), or a gallium tin oxide (GTO), and at least one conductive material among conductive polymers such as poly(3,4-ethylenedioxythiophene) (PEDOT), but the disclosure is not limited thereto.

The first electrode ALE1 may be electrically connected to the first transistor electrode TE1 of the transistor M through a contact hole penetrating the via layer VIA and the passivation layer PSV. The third electrode ALE3 may be electrically connected to the third power conductive layer PL2c through a contact hole penetrating the via layer VIA and the passivation layer PSV.

A first insulation layer INS1 may be disposed on electrodes ALE. The first insulation layer INS1 may be configured as a single layer or multilayer, and may include at least one of a silicon oxide ($SiO_x$), a silicon nitride ($SiN_x$), a silicon oxynitride ($SiO_xN_y$), an aluminum nitride ($AlN_x$), an aluminum oxide ($AlO_x$), a zirconium oxide ($ZrO_x$), a hafnium oxide ($HfO_x$), and a titanium oxide ($TiO_x$), and various types of inorganic materials.

The second bank patterns BNP2 may be disposed on the first insulation layer INS1. The second bank patterns BNP2 may form a dam structure that partitions a light emitting area to which the light emitting elements LD are to be supplied in a step of supplying the light emitting elements LD to each of the pixels PXL. For example, a desired type and/or amount of light emitting element ink may be supplied to an area partitioned by the second bank patterns BNP2.

The second bank patterns BNP2 may include an organic material such as an acrylates resin, an epoxy resin, a phenolic resin, a polyamides resin, a polyimides rein, a polyesters resin, a polyphenylenesulfides resin, or a benzocyclobutene (BCB). However, the disclosure is not limited thereto, and the second bank patterns BNP2 may be configured as a single layer or multilayer, and may include at least one of a silicon oxide ($SiO_x$), a silicon nitride ($SiN_x$), a silicon oxynitride ($SiO_xN_y$), an aluminum nitride ($AlN_x$), an aluminum oxide ($AlO_x$), a zirconium oxide ($ZrO_x$), a hafnium oxide ($HfO_x$), and a titanium oxide ($TiO_x$), and various types of inorganic materials.

In some embodiments, the second bank patterns BNP2 may include at least one light blocking and/or at least one reflective material. Accordingly, light leakage between adjacent pixels PXL may be prevented. For example, the second bank patterns BNP2 may include at least one of a black matrix material and/or a color filter material. For example, the second bank patterns BNP2 may be formed in a black opaque pattern that may block transmission of light. In the embodiment, a reflective film (not shown) may be formed on a surface (for example, a side wall) of the second bank patterns BNP2 to increase the light efficiency of each pixel PXL.

The light emitting elements LD may be disposed on the first insulation layer INS1. The light emitting elements LD may be disposed between the electrodes ALE on the first insulation layer INS1. The light emitting elements LD may be prepared in a form dispersed in light emitting element ink, and may be supplied to each pixel PXL by an inkjet printing method and the like. For example, the light emitting elements LD may be dispersed in a volatile solvent to be provided in each pixel PXL. Subsequently, in case that an alignment signal is supplied to the electrodes ALE, an electric field is formed between the electrodes ALE, so that the light emitting elements LD may be aligned between the electrodes ALE. After the light emitting elements LD are aligned, the light emitting elements LD may be stably arranged between the electrodes ALE by volatilizing the solvent or eliminating it in other ways.

A second insulation layer INS2 may be disposed on the light emitting elements LD. For example, the second insulation layer INS2 is partially provided on the light emitting elements LD, and may expose the first and second end portions EP1 and EP2 of the light emitting elements LD. In case that the second insulation layer INS2 is formed on the light emitting elements LD after the alignment of the light emitting elements LD is completed, it is possible to prevent the light emitting elements LD from deviating from an aligned position.

The second insulation layer INS2 may be configured as a single layer or multilayer, and may include at least one of a silicon oxide ($SiO_x$), a silicon nitride ($SiN_x$), a silicon oxynitride ($SiO_xN_y$), an aluminum nitride ($AlN_x$), an aluminum oxide ($AlO_x$), a zirconium oxide ($ZrO_x$), a hafnium oxide ($HfO_x$), and a titanium oxide ($TiO_x$), and various types of inorganic materials.

The connection electrodes ELT may be disposed on the first and second end portions EP1 and EP2 of the light emitting elements LD exposed by the second insulation layer INS2. The first connection electrode ELT1 may be directly disposed on the first end portions EP1 of the first light emitting elements LD1 to contact the first end portions EP1 of the first light emitting elements LD1.

In addition, the second connection electrode ELT2 may be directly disposed on the second end portions EP2 of the first light emitting elements LD1 to contact the second end portions EP2 of the first light emitting elements LD1. In addition, the second connection electrode ELT2 may be directly disposed on the first end portions EP1 of the second light emitting elements LD2 to contact the first end portions EP1 of the second light emitting elements LD2. For example, the second connection electrode ELT2 may electrically connect the second end portions EP2 of the first light emitting elements LD1 to the first end portions EP1 of the second light emitting elements LD2.

Similarly, the third connection electrode ELT3 may be directly disposed on the second end portions EP2 of the second light emitting elements LD2 to contact the second end portions EP2 of the second light emitting elements LD2. In addition, the third connection electrode ELT3 may be directly disposed on the first end portions EP1 of the third light emitting elements LD3 to contact the first end portions EP1 of the third light emitting elements LD3. For example, the third connection electrode ELT3 may electrically connect the second end portions EP2 of the second light emitting elements LD2 to the first end portions EP1 of the third light emitting elements LD3.

Similarly, the fourth connection electrode ELT4 may be directly disposed on the second end portions EP2 of the third light emitting elements LD3 to contact the second end portions EP2 of the third light emitting elements LD3. In addition, the fourth connection electrode ELT4 may be directly disposed on the first end portions EP1 of the fourth light emitting elements LD4 to contact the first end portions EP1 of the fourth light emitting elements LD4. For example, the fourth connection electrode ELT4 may electrically connect the second end portions EP2 of the third light emitting elements LD3 to the first end portions EP1 of the fourth light emitting elements LD4.

Similarly, the fifth connection electrode ELT5 may be directly disposed on the second end portions EP2 of the fourth light emitting elements LD4 to contact the second end portions EP2 of the fourth light emitting elements LD4.

In the embodiment, some of the connection electrodes ELT may be disposed on a same layer. For example, the first connection electrode ELT1, the third connection electrode ELT3, and the fifth connection electrode ELT5 may be disposed on a same layer. In addition, the second connection electrode ELT2 and the fourth connection electrode ELT4 may be disposed on a same layer. For example, the first connection electrode ELT1, the third connection electrode ELT3, and the fifth connection electrode ELT5 may be disposed on the second insulation layer INS2. A third insulation layer INS3 may be disposed on the first connection electrode ELT1, the third connection electrode ELT3, and the fifth connection electrode ELT5. The second connection electrode ELT2 and the fourth connection electrode ELT4 may be disposed on the third insulation layer INS3.

The third insulation layer INS3 may expose the second end portions EP2 of the light emitting elements LD. The connection electrodes ELT may be formed on the second end portions EP2 of the light emitting elements LD exposed by the third insulation layer INS3.

As described above, in case that the third insulation layer INS3 is disposed between the connection electrodes ELT made of different conductive layers, since the connection electrodes ELT may be stably separated by the third insulation layer INS3, it is possible to ensure electrical stability between the first and second end portions EP1 and EP2 of the light emitting elements LD.

The connection electrodes ELT may be made of various transparent conductive materials. For example, the connection electrodes ELT may include at least one of various transparent conductive materials including an indium tin oxide (ITO), an indium zinc oxide (IZO), an indium tin zinc oxide (ITZO), an aluminum zinc oxide (AZO), a gallium zinc oxide (GZO), a zinc tin oxide (ZTO), and a gallium tin oxide (GTO), and may be realized to be substantially transparent or translucent to satisfy a light transmittance (e.g., a predetermined or selected light transmittance). Accordingly, the light emitted from the first and second end portions EP1 and EP2 of the light emitting elements LD may pass through the connection electrodes ELT to be emitted to the outside of the display panel PNL.

The third insulation layer INS3 may be configured as a single layer or multilayer, and may include at least one of a silicon oxide ($SiO_x$), a silicon nitride ($SiN_x$), a silicon oxynitride ($SiO_xN_y$), an aluminum nitride ($AlN_x$), an aluminum oxide ($AlO_x$), a zirconium oxide ($ZrO_x$), a hafnium oxide ($HfO_x$), and a titanium oxide ($TiO_x$), and various types of inorganic materials.

According to the above-described embodiment, the first area A1 of the bank BNK may provide a space that may accommodate the color conversion layer CCL overflowing from the opening OP in a process of supplying the color conversion layer CCL into the opening OP (or the light emitting area EA). Accordingly, it is possible to prevent the color conversion layer CCL provided in each pixel PXL from overflowing into the adjacent pixels PXL.

In addition, since the first area A1 of the bank BNK partially compensates for a step caused by the second area A2, it is possible to prevent air bubbles from being generated due to the step even if a photoresist is provided on the bank BNK in a subsequent process. In other words, by minimizing bursting of the photoresist due to the air bubbles, it is possible to improve a stain defect caused by deformation and residual of the photoresist in the subsequent process, and thus, it is possible to improve display quality.

Hereinafter, an embodiment will be described. The same elements as those described above will be denoted by the same reference numerals in embodiments below, and repetitive descriptions thereof will be omitted or simplified.

Figure 11:
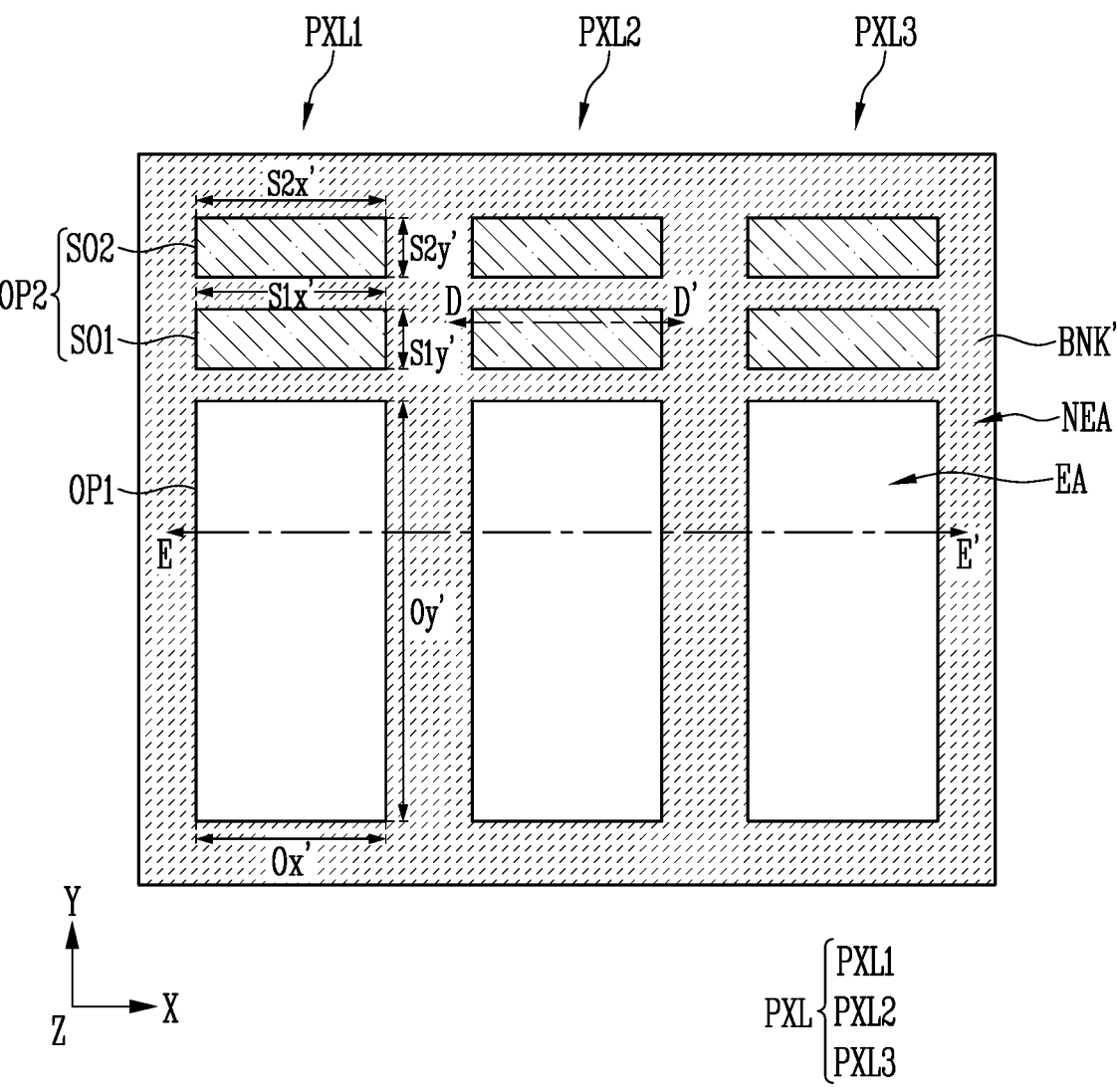
FIG. 11 and FIG. 12 illustrate schematic plan views of a pixel according to another embodiment.
Figure 12:
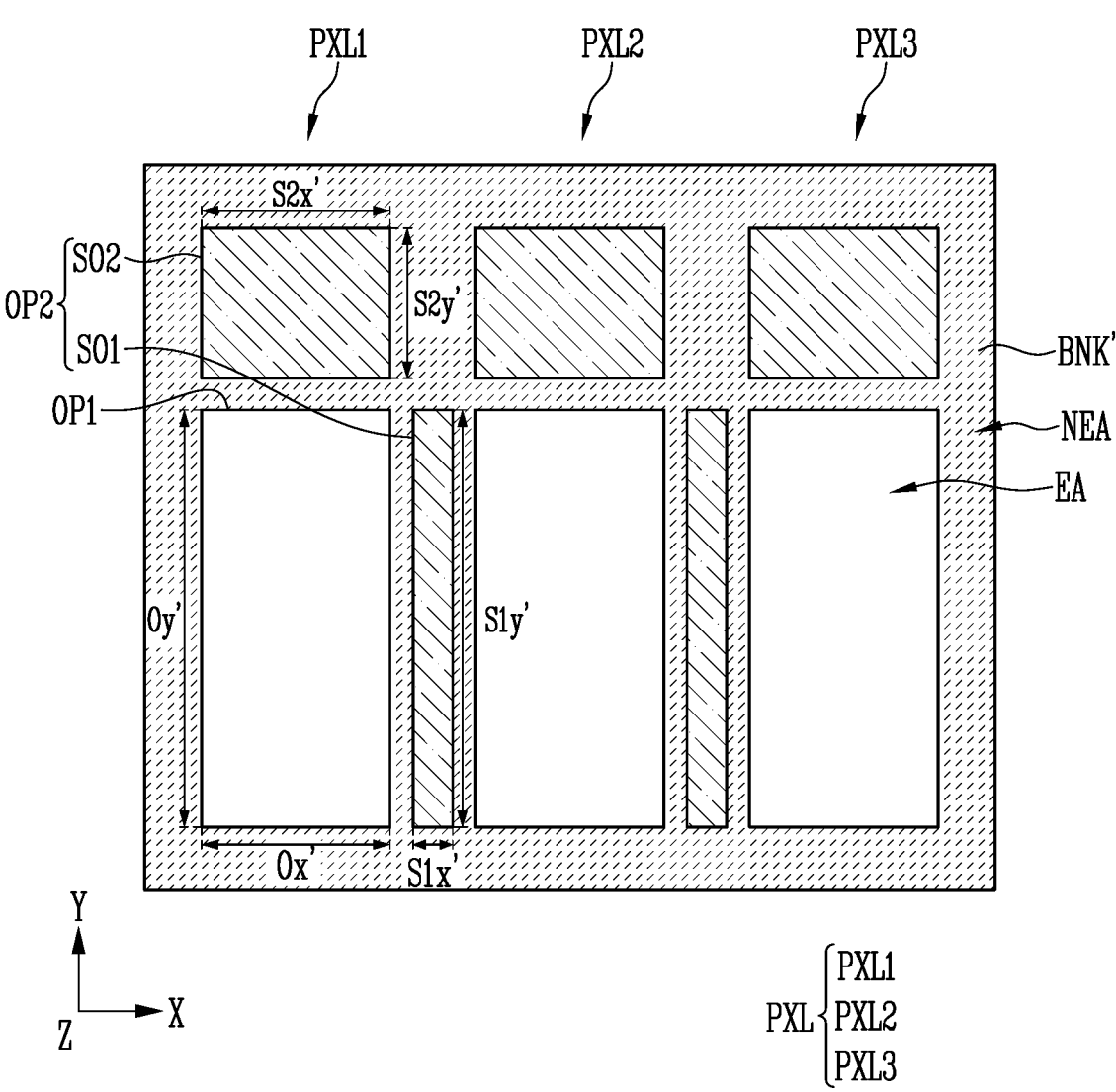
Figure 13:
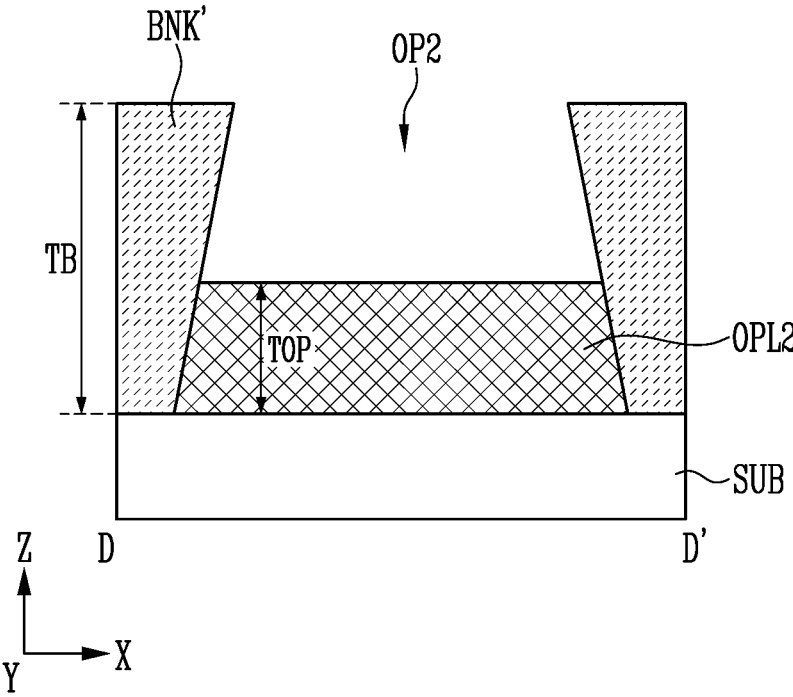
FIG. 13 illustrates a schematic cross-sectional view taken along line D-D' of FIG. 11.
Figure 14:
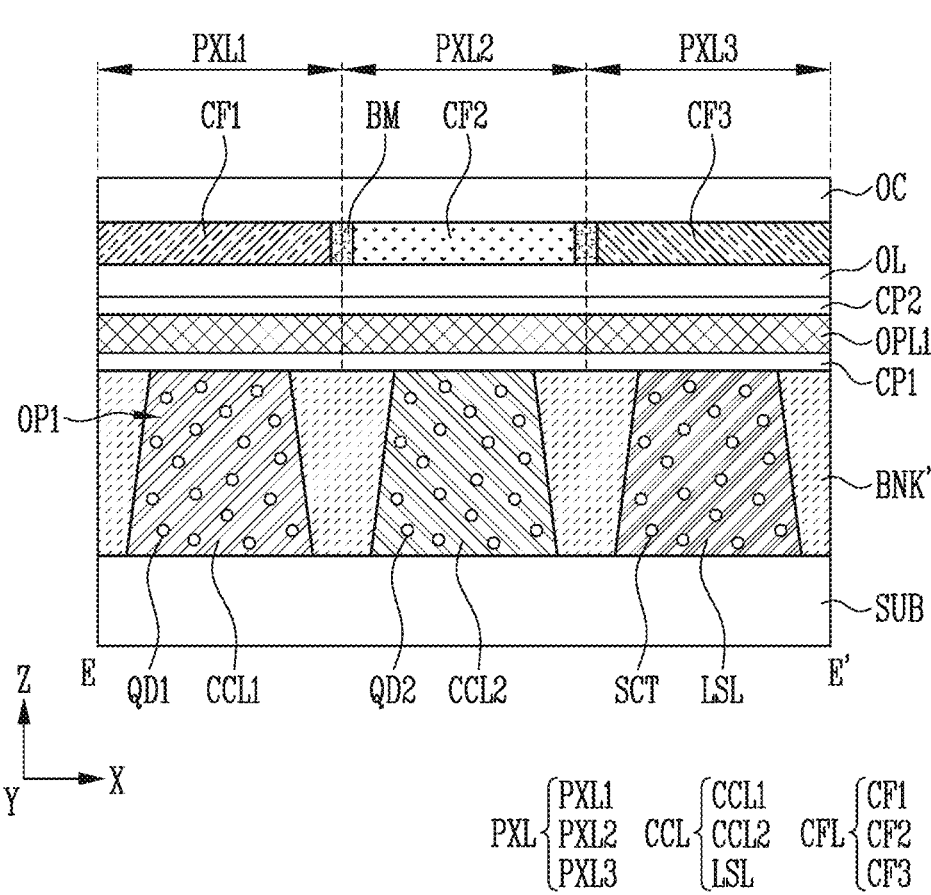
FIG. 14 illustrates a schematic cross-sectional view taken along line E-E' of FIG. 11.

FIGS. 11 and 12 illustrate schematic plan views of a pixel according to another embodiment. FIG. 13 illustrates a schematic cross-sectional view taken along line D-D' of FIG. 11. FIG. 14 illustrates a schematic cross-sectional view taken along line E-E' of FIG. 11.

Referring to FIGS. 11 and 12, the embodiments are distinguished from the embodiment of FIGS. 1 to 10 in that a bank BNK' includes a first opening OP1 and a second opening OP2.

The bank BNK' may include the first opening OP1 overlapping the light emitting area EA. The first opening OP1 of the bank BNK' may expose the light emitting area EA. The first opening OP1 of the bank BNK' may define an area to which the color conversion layer CCL is to be supplied in the step of supplying the color conversion layer CCL to the pixels PXL. For example, the light emitting area EA is partitioned by the first opening OP1 of the bank BNK', so that a desired type and/or amount of the color conversion layer CCL may be supplied into the light emitting area EA.

The bank BNK' may include the second opening OP2 overlapping the non-light emitting area NEA. The second opening OP2 may be spaced apart from the first opening OP1. The second opening OP2 may provide a space that may accommodate the color conversion layer CCL overflowing from the first opening OP1 in the process of supplying the color conversion layer CCL into the first opening OP1 (or light emitting area EA). Accordingly, it is possible to prevent the color conversion layer CCL provided in each pixel PXL from overflowing into the adjacent pixels PXL.

The second opening OP2 may include a first sub-opening SO1 and a second sub-opening SO2 spaced apart from each other. Referring to FIG. 11, the first sub-opening SO1 and the second sub-opening SO2 may be spaced apart from the first opening OP1 in the second direction (Y-axis direction). For example, the first opening OP1, the first sub-opening SO1, and the second sub-opening SO2 may be sequentially arranged in the second direction (Y-axis direction).

A width $S1x'$ in the first direction (X-axis direction) of the first sub-opening SO1 may be substantially the same as a width $S2x'$ in the first direction (X-axis direction) of the second sub-opening SO2. In addition, the width $S1x'$ in the first direction (X-axis direction) of the first sub-opening SO1 and/or the width $S2x'$ in the first direction (X-axis direction) of the second sub-opening SO2 may be substantially the same as a width $Ox'$ in the first direction (X-axis direction) of the first opening OP1. In addition, a width $Sly'$ of the first sub-opening SO1 in the second direction (Y-axis direction) may be substantially the same as a width $S2y'$ of the second sub-opening SO2 in the second direction (Y-axis direction). In addition, the width $S1y'$ of the first sub-opening SO1 in the second direction (Y-axis direction) and/or the width $S2y'$ of the second sub-opening SO2 in the second direction (Y-axis direction) may be different from a width $Oy'$ of the first opening OP1 in the second direction (Y-axis direction). For example, the width $S1y'$ of the first sub-opening SO1 in the second direction (Y-axis direction) and/or the width $S2y'$ of the second sub-opening SO2 in the second direction (the Y-axis direction) may be smaller than the width $Oy'$ of the first opening OP1 in the second direction (Y-axis direction). However, the positions and sizes of the first opening OP1, the first sub-opening SO1, and/or the second sub-opening SO2 are not limited to the embodiment illustrated in FIG. 11, and may be variously changed.

Referring to FIG. 12, the first sub-opening SO1 may be spaced from the first opening OP1 in the first direction (X-axis direction), and the second sub-opening SO2 may be spaced apart from the first opening OP1 in the second direction (Y-axis direction). For example, the first sub-opening SO1 may be disposed between the first to third pixels PXL1, PXL2, and PXL3.

The width $S1x'$ in the first direction (X-axis direction) of the first sub-opening SO1 may be different from the width $S2x'$ in the first direction (X-axis direction) of the second sub-opening SO2. For example, the width $S1x'$ in the first direction (X-axis direction) of the first sub-opening SO1 may be smaller than the width $S2x'$ in the first direction (X-axis direction) of the second sub-opening SO2. In addition, the width $S1x'$ of the first sub-opening SO1 in the first direction (X-axis direction) may be different from the width $Ox'$ of the first opening OP1 in the first direction (X-axis direction). For example, the width $S1x'$ of the first sub-opening SO1 in the first direction (X-axis direction) may be smaller than the width $Ox'$ of the first opening OP1 in the first direction (X-axis direction). In addition, the width $S2x'$ of the second sub-opening SO2 in the first direction (X-axis direction) may be substantially the same as the width $Ox'$ of the first opening OP1 in the first direction (X-axis direction).

The width $S1y'$ of the first sub-opening SO1 in the second direction (Y-axis direction) may be different from the width $S2y'$ of the second sub-opening SO2 in the second direction (Y-axis direction). For example, the width $S1y'$ of the first sub-opening SO1 in the second direction (Y-axis direction) may be greater than the width $S2y'$ of the second sub-opening SO2 in the second direction (Y-axis direction). In addition, the width $Sly'$ of the first sub-opening SO1 in the second direction (Y-axis direction) may be substantially the same as the width $Oy'$ of the first opening OP1 in the second direction (Y-axis direction). In addition, the width $S2y'$ of the second sub-opening SO2 in the second direction (Y-axis direction) may be different from the width $Oy'$ of the first opening OP1 in the second direction (Y-axis direction). For example, the width $S2y'$ of the second sub-opening SO2 in the second direction (Y-axis direction) may be smaller than the width $Oy'$ of the first opening OP1 in the second direction (Y-axis direction). However, the positions and sizes of the first opening OP1, the first sub-opening SO1, and/or the second sub-opening SO2 are not limited to the embodiment illustrated in FIG. 12, and may be variously changed.

FIG. 13 illustrates a cross-section of the second opening OP2 of the bank BNK' provided in the non-light emitting area NEA. Referring to FIG. 13, the bank BNK' may be disposed on the light emitting substrate SUB. A detailed description of a cross-sectional structure of the light emitting substrate SUB will be described below with reference to FIG. 14.

A second optical layer OPL2 may be disposed within the second opening OP2 of the bank BNK'. A thickness TB of the bank BNK' in the third direction (Z-axis direction) may be greater than a thickness TOP of the second optical layer OPL2 in the third direction (Z-axis direction). The second optical layer OPL2 may partially compensate for a step caused by the bank BNK'. In this case, even if a photoresist is provided on the second opening OP2 of the bank BNK' in the subsequent process, it is possible to prevent generation of air bubbles due to the step of the bank BNK', so it is possible to minimize bursting of a photoresist due to the air bubbles. In other words, it is possible to improve display quality because it is possible to reduce stain defects caused by deformation of the photoresist and the residue in the subsequent process. For example, in case that the thickness TB in the third direction (Z-axis direction) of the bank BNK' is formed to be about 11 μm to about 15 μm, the thickness TOP in the third direction (Z-axis direction) of the second optical layer OPL2 may be formed to be about 6 μm or more, but the disclosure is not limited thereto.

A refractive index of the second optical layer OPL2 may be about 1.1 to about 1.3, but the disclosure is not limited thereto. In some embodiments, the second optical layer OPL2 may include a base resin and hollow particles dispersed in the base resin. The hollow particles may include hollow silica particles. In addition, the hollow particle may be a pore formed by a porogen, but the disclosure is not limited thereto. In addition, the second optical layer OPL2 may include at least one of titanium dioxide ($TiO_2$) particles and nano silicate particles, but the disclosure is not limited thereto.

FIG. 14 illustrates the bank BNK', the color conversion layer CCL, a first optical layer OPL1, and/or the color filter layer CFL provided in the first to third pixels PXL1, PXL2, and PXL3.

Referring to FIG. 14, the bank BNK' is disposed between the first to third pixels PXL1, PXL2, and PXL3 or at a boundary therebetween, and may include the first opening OP1 overlapping the light emitting area EA (see FIG. 11) of each of the first to third pixels PXL1, PXL2, and PXL3. The first opening OP1 of the bank BNK' may provide a space in which the color conversion layer CCL may be provided.

The color conversion layer CCL may be disposed on the light emitting elements LD and the light emitting substrate SUB within the first opening OP of the bank BNK'. The color conversion layer CCL may include the first color conversion layer CCL1 disposed on the first pixel PXL1, the second color conversion layer CCL2 disposed on the second pixel PXL2, and the scattering layer LSL disposed on the third pixel PXL3.

The first capping layer CP1 may be disposed on the color conversion layer CCL. The first capping layer CP1 may be entirely disposed on the first to third pixels PXL1, PXL2, and PXL3.

The first optical layer OPL1 may be disposed on the first capping layer CP1. The first optical layer OPL1 may be entirely provided on the first to third pixels PXL1, PXL2, and PXL3.

The first optical layer OPL1 may serve to improve light extraction efficiency by recycling light provided from the color conversion layer CCL by total reflection. To this end, the first optical layer OPL1 may have a relatively low refractive index compared to the color conversion layer CCL. For example, the refractive index of the color conversion layer CCL may be about 1.6 to about 2.0, and the refractive index of the first optical layer OPL1 may be about 1.1 to about 1.3, but the disclosure is not limited thereto.

The first optical layer OPL1 may include a base resin and hollow particles dispersed in the base resin. The hollow particles may include hollow silica particles. In addition, the hollow particle may be a pore formed by a porogen, but the disclosure is not limited thereto. In addition, the first optical layer OPL1 may include at least one of titanium dioxide ($TiO_2$) particles and nano silicate particles, but the disclosure is not limited thereto. In some embodiments, the first optical layer OPL1 and the second optical layer OPL2 described above may be made of a same material. For example, the first optical layer OPL1 and the second optical layer OPL2 may be simultaneously provided in a same process.

The second capping layer CP2 may be disposed on the first optical layer OPL1. The second capping layer CP2 may be entirely disposed on the first to third pixels PXL1, PXL2, and PXL3. The second capping layer CP2 may cover the first optical layer OPL1. The second capping layer CP2 may prevent impurities such as moisture or air from penetrating from the outside to damage or contaminate the first optical layer OPL1.

The planarization layer OL may be disposed on the second capping layer CP2. The planarization layer OL may be entirely provided across the first to third pixels PXL1, PXL2, and PXL3.

The color filter layer CFL may be disposed on the planarization layer OL. The color filter layer CFL may include the color filters CF1, CF2, and CF3 matching the respective colors of the pixels PXL. A full-color image may be displayed by disposing the color filters CF1, CF2, and CF3 matching the respective colors of the first to third pixels PXL1, PXL2, and PXL3.

The color filter layer CFL may include the first color filter CF1 that is disposed in the first pixel PXL1 to selectively transmit light emitted by the first pixel PXL1, the second color filter CF2 that is disposed in the second pixel PXL2 to selectively transmit light emitted by the second pixel PXL2, and the third color filter CF3 that is disposed in the third pixel PXL3 to selectively transmit light emitted by the third pixel PXL3.

In some embodiments, the light blocking layer BM may be further disposed between the first to third color filters CF1, CF2, and CF3 or at a boundary therebetween, and in this case, in case that the light blocking layer BM is formed between the first to third color filters CF1, CF2, and CF3, it is possible to prevent a color mixing defect viewed from a front or side of a display device.

The overcoat layer OC may be disposed on the color filter layer CFL. The overcoat layer OC may be entirely provided in the first to third pixels PXL1, PXL2, and PXL3.

According to the embodiment described above, the second opening OP2 of the bank BNK' may provide a space that may accommodate the color conversion layer CCL overflowing from the first opening OP1 in the process of supplying the color conversion layer CCL into the first opening OP1 (or light emitting area EA). Accordingly, it is possible to prevent the color conversion layer CCL provided in each pixel PXL from overflowing into the adjacent pixels PXL.

In addition, since the second optical layer OPL2 provided in the second opening OP2 of the bank BNK' partially compensates for the step due to the bank BNK', even if a photoresist is provided on the bank BNK' in the subsequent process, it is possible to prevent the air bubbles from being generated due to the step. In other words, by minimizing bursting of the photoresist due to the air bubbles, it is possible to improve a stain defect caused by deformation and residue of the photoresist in the subsequent process, and thus, it is possible to improve display quality, as described above.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:
1. A display device comprising:
a display panel comprising pixels and having a light emitting area and a non-light emitting area;
light emitting elements disposed in the light emitting area; and
a bank disposed in the non-light emitting area and on a substrate,
wherein the bank includes:
an opening overlapping the light emitting area in a plan view;
a first area spaced apart from the opening; and a second area surrounding the opening and the first area, wherein a thickness of the second area is greater than a thickness of the first area, and wherein the first area and the second area are entirely formed of a same material.

2. The display device of claim 1, further comprising:

a first electrode and a second electrode spaced apart from each other, wherein the light emitting elements are disposed between the first electrode and the second electrode.

3. The display device of claim 2, further comprising:

a first connection electrode disposed on a first end portion of the light emitting elements and on the first electrode; and a second connection electrode disposed on a second end portion of the light emitting elements and on the second electrode.

4. The display device of claim 1, wherein the first area includes:

a first sub-area spaced apart from the opening in a first direction; and a second sub-area spaced apart from the opening in a second direction intersecting the first direction.

5. The display device of claim 4, wherein a width in the second direction of the first sub-area is substantially equal to a width in the second direction of the opening.

6. The display device of claim 4, wherein a width in the first direction of the second sub-area is substantially equal to a width in the first direction of the opening.

7. The display device of claim 1, wherein the first area includes a first sub-area and a second sub-area spaced apart from each other, and the opening, the first sub-area, and the second sub-area are arranged in a second direction.

8. The display device of claim 7, wherein a width in a first direction of the first sub-area and/or a width in the first direction of the second sub-area are equal to a width in the first direction of the opening, the first direction intersecting the second direction.

9. The display device of claim 1, further comprising:

a color conversion layer disposed in the opening.

10. The display device of claim 1, wherein a thickness of the first area is about 6 μm or more.

11. The display device of claim 1, wherein the bank has a reversed-tapered shape.

12. A display device comprising:

a display panel comprising pixels and having a light emitting area and a non-light emitting area;

a bank including a first opening overlapping in a plan view the light emitting area and a second opening overlapping the non-light emitting area;

a color conversion layer disposed in the first opening;

a first optical layer disposed on the color conversion layer; and a second optical layer disposed in the second opening.

13. The display device of claim 12, wherein a thickness of the bank is greater than a thickness of the second optical layer.

14. The display device of claim 12, wherein a thickness of the second optical layer is about 6 μm or more.

15. The display device of claim 12, wherein a refractive index of the first optical layer and/or a refractive index of the second optical layer are about 1.1 to about 1.3.

16. The display device of claim 15, wherein the first optical layer and the second optical layer include a same material.

17. The display device of claim 12, further comprising:

a capping layer disposed between the color conversion layer and the first optical layer.

18. The display device of claim 12, wherein the pixels include:

a first pixel emitting light of a first color;

a second pixel emitting light of a second color; and a third pixel emitting light of a third color.

19. The display device of claim 18, wherein the color conversion layer includes:

a first color conversion layer disposed in the first pixel;

a second color conversion layer disposed in the second pixel; and a scattering layer disposed in the third pixel.

20. The display device of claim 19, further comprising:

a first color filter disposed on the first color conversion layer;

a second color filter disposed on the second color conversion layer; and a third color filter disposed on the scattering layer.

* * * * *